(12) United States Patent
Tanaka et al.

(10) Patent No.: US 7,772,523 B2
(45) Date of Patent: Aug. 10, 2010

(54) LASER IRRADIATION APPARATUS AND LASER IRRADIATION METHOD

(75) Inventors: Koichiro Tanaka, Isehara (JP); Yoshiaki Yamamoto, Hadano (JP); Takatsugu Omata, Tochigi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 769 days.

(21) Appl. No.: 10/586,048

(22) PCT Filed: Jul. 28, 2005

(86) PCT No.: PCT/JP2005/014264

§ 371 (c)(1),
(2), (4) Date: Jul. 14, 2006

(87) PCT Pub. No.: WO2006/011671

PCT Pub. Date: Feb. 2, 2006

(65) Prior Publication Data

US 2007/0158315 A1    Jul. 12, 2007

(30) Foreign Application Priority Data

Jul. 30, 2004    (JP)    ............................. 2004-224676

(51) Int. Cl.
*B23K 26/08* (2006.01)
*B23K 26/06* (2006.01)
(52) U.S. Cl. ................................. 219/121.8; 219/121.73
(58) Field of Classification Search .. 219/121.6–121.86
See application file for complete search history.

(56) References Cited

U.S. PATENT DOCUMENTS

| 5,864,430 | A | * | 1/1999 | Dickey et al. | ............... | 359/559 |
| 6,393,042 | B1 | * | 5/2002 | Tanaka | ....................... | 372/101 |
| 6,524,977 | B1 | * | 2/2003 | Yamazaki et al. | ........... | 438/799 |
| 6,791,060 | B2 | | 9/2004 | Dunsky et al. | | |
| 6,800,541 | B2 | * | 10/2004 | Okumura | .................... | 438/487 |
| 2003/0230749 | A1 | | 12/2003 | Isobe et al. | | |

(Continued)

FOREIGN PATENT DOCUMENTS

CN          1351529          5/2002

(Continued)

OTHER PUBLICATIONS

Office Action (Application No. 200580032554.9) Dated Apr. 18, 2008.

(Continued)

*Primary Examiner*—Sang Y Paik
(74) *Attorney, Agent, or Firm*—Eric J. Robinson; Robinson Intellectual Property Law Office, P.C.

(57) ABSTRACT

It is an object of the present invention to provide a laser irradiation apparatus and a laser irradiation method for conducting a laser process homogeneously to the whole surface of a semiconductor film. A first laser beam emitted from a first laser oscillator passes through a slit and a condensing lens and then enters an irradiation surface. At the same time, a second laser beam emitted from a second laser oscillator is delivered so as to overlap the first laser beam on the irradiation surface. Further, the laser beams are scanned relative to the irradiation surface to anneal the irradiation surface homogeneously.

12 Claims, 20 Drawing Sheets

U.S. PATENT DOCUMENTS

| | | | |
|---|---|---|---|
| 2004/0069751 A1 | 4/2004 | Yamazaki et al. | |
| 2004/0119955 A1* | 6/2004 | Tanaka | 355/51 |
| 2006/0019474 A1* | 1/2006 | Inui et al. | 438/487 |

FOREIGN PATENT DOCUMENTS

| | | |
|---|---|---|
| EP | 1 326 273 | 7/2003 |
| JP | 2000-012484 | 1/2000 |
| JP | 2003-257865 | 9/2003 |
| JP | 2004-128421 | 4/2004 |
| JP | 2004-297055 | 10/2004 |
| WO | WO 00-73013 | 12/2000 |

OTHER PUBLICATIONS

International Search Report (Application No. PCT/JP2005/014264) dated Oct. 25, 2005.

Written Opinion (Application No. PCT/JP2005/014264) dated Oct. 25, 2005.

* cited by examiner (x) threshold at which crystalline region is formed
(y) threshold at which crystalline region having large crystal grain is formed (x) threshold at which crystalline region is formed
(y) threshold at which crystalline region having large crystal grain is formed

LASER IRRADIATION APPARATUS AND LASER IRRADIATION METHOD

TECHNICAL FIELD

The present invention relates to a laser irradiation apparatus (an apparatus including a laser and an optical system for guiding a laser beam emitted from the laser to an irradiation object) and a laser irradiation method which conduct annealing, for example, for a semiconductor material homogeneously and effectively. Further, the present invention relates to a method for manufacturing a semiconductor device by applying the laser process.

BACKGROUND ART

In recent years, a technique for manufacturing a thin film transistor (hereinafter referred to as a TFT) over a substrate has made a great progress, and application to an active matrix display device has been advanced. In particular, a TFT formed using a poly-crystalline semiconductor film is superior in field-effect mobility (also referred to as mobility simply) to a TFT formed using a conventional amorphous semiconductor film, and therefore high-speed operation has become possible. For this reason, it has been tried that a pixel, which was conventionally controlled by a driver circuit provided outside the substrate, is controlled by a driver circuit formed over the same substrate as the pixel.

A substrate used for a semiconductor device is expected to be a glass substrate rather than a quartz substrate or a single-crystal semiconductor substrate in terms of cost. However, a glass substrate is inferior in heat resistance and easy to be deformed due to heat. Therefore, when the TFT using the poly-crystalline semiconductor film is formed over a glass substrate, laser annealing is often employed to crystallize a semiconductor film formed over the glass substrate in order to prevent the glass substrate from being deformed due to the heat.

Compared with another annealing method which uses radiant heat or conductive heat, the laser annealing has advantages that the process time can be shortened drastically and that a semiconductor substrate or a semiconductor film over a substrate can be heated selectively and locally so that thermal damage is hardly given to the substrate.

Laser oscillators used for the laser annealing are categorized as pulsed laser oscillators and continuous wave (CW) laser oscillators according to the oscillation method. In recent years, it has been known that the crystal grain formed in the semiconductor film becomes larger when using the CW laser oscillator such as an Ar laser or a $YVO_4$ laser than when using the pulsed laser oscillator such as an excimer laser in crystallizing the semiconductor film. When the crystal grain in the semiconductor film becomes larger, the number of crystal grain boundaries in the channel region of a TFT formed using this semiconductor film decreases, and the carrier mobility becomes higher so that a more sophisticated device can be developed. For this reason, the CW laser oscillator is attracting attention.

Generally, a laser beam which is used for laser annealing of a semiconductor film has a linear spot shape and the laser annealing is conducted by scanning the linear spot of the laser beam on the semiconductor film. By shaping the laser beam into the linear spot, the area annealed by the laser beam at one time can be made larger. In this specification, laser beams having a linear shape and a rectangle shape on an irradiation surface are referred to as a linear beam and a rectangular beam, respectively. It is to be noted that the term of linear herein used does not mean a line in a strict sense but means a rectangle having a large aspect ratio (for example, aspect ratio of 10 or more (preferably 100 to 10000)). The laser beam is shaped into a linear spot because energy density required for sufficient annealing to an irradiation object can be secured. When sufficient annealing can be conducted to the irradiation object, the laser beam may be shaped into a rectangular or planar spot. In the future, laser annealing may be conducted with a planar beam.

On the other hand, when a silicon film having a thickness of several tens to several hundred nm, which is generally used in a semiconductor device, is crystallized with a YAG laser or a $YVO_4$ laser, the second harmonic having a shorter wavelength than the fundamental wave is used. This is because the second harmonic has higher absorption coefficient of a laser beam to a semiconductor film than the fundamental wave and the semiconductor film can be crystallized effectively with the second harmonic. The fundamental wave is rarely used in this step.

However, laser annealing with the use of a CW laser oscillator has a problem in that an annealing state on an irradiation surface becomes inhomogeneous. The reason lies in that a laser beam emitted from a CW laser oscillator has Gaussian distribution in which the energy is attenuated from the center to the end. Therefore, homogeneous annealing is difficult.

The present applicant has already suggested a laser irradiation apparatus which solved the problem of the conventional laser irradiation apparatus.

[Patent Document 1] Japanese Patent Application Laid-Open No. 2004-128421

According to the laser irradiation apparatus disclosed in Patent Document 1, two laser beams are used. Specifically, a CW laser beam converted into the second harmonic and a CW laser beam of the fundamental wave are delivered simultaneously.

DISCLOSURE OF INVENTION

FIG. 11 shows an irradiation track of a beam spot 1101 on a semiconductor film and energy density distribution 1102 of the beam spot 1101 at a cross section A.

Generally, a cross section of a laser beam emitted from a CW laser oscillator with $TEM_{00}$ (single transverse mode) does not have homogeneous energy density distribution but has Gaussian energy distribution as shown with the energy density distribution 1102 in FIG. 11.

For example, the energy density of the beam spot in its central portion 1103 is set higher than the threshold (y) at which one crystal grain that is large enough to form at least one TFT therein is obtained. This crystal grain is hereinafter referred to as a large crystal grain. The energy density of the beam spot in its end portion 1104 is higher than the threshold (x) at which a crystalline region is formed and is lower than the threshold (y). Therefore, when the semiconductor film is irradiated with the laser beam, some parts of a region irradiated with the end portion 1104 of the beam spot are not melted completely. In this not-melted region, not the large crystal grain which is formed by the central portion of the beam spot but only a crystal grain having relatively small grain diameter (hereinafter referred to as a microcrystal) is formed.

A semiconductor element formed in the region where the microcrystal is formed, that is, the region irradiated with the end portion 1104 of the beam spot cannot be expected to have high characteristic. In order to avoid this, it is necessary to form the semiconductor element in the region where the large crystal grain is formed, that is, the region irradiated with the central portion 1103 of the beam spot. In such a case, it is apparent that the layout is restricted. Accordingly, it is required to decrease the proportion of the region where the microcrystal is formed in the whole region irradiated with the laser beam.

On the surface of the region irradiated with the end portion 1104 of the beam spot, concavity and convexity (ridge) as high as the thickness of the semiconductor film are formed. In the case of forming TFTs with the semiconductor film where the ridge is formed, it is difficult to form a gate insulating film in contact with an active layer so as to have uniform thickness. Therefore, the thinning of the gate insulating film is difficult. As a result, problems occur in which the miniaturization of TFTs formed here is interrupted and so on.

Even when the laser beam having the energy distribution shown in FIG. 11 is shaped into a linear or rectangular beam, the end portion of the laser beam has lower energy density than the central portion thereof. Therefore, it is required to homogenize the energy density distribution of the laser beam. When annealing is conducted so that crystal grains have the same size in any part of a semiconductor film, the characteristics of TFTs formed with this semiconductor film are superior and homogeneous.

It is an object of the present invention to solve the above problems and to provide a laser irradiation apparatus which can conduct a laser process homogeneously to the whole surface of the semiconductor film.

In order to achieve the above object, the present invention employs the following structure. It is to be noted that the laser annealing method herein described indicates a technique to crystallize an amorphous region or a damaged region formed by, for example, injecting ions into a semiconductor substrate or a semiconductor film, a technique to crystallize a semiconductor film by irradiating an amorphous semiconductor film formed over a substrate with a laser beam, a technique to crystallize a crystalline semiconductor film which is not single crystal (the above-mentioned semiconductor films which are not single crystal are collectively referred to as an amorphous semiconductor film) by conducting laser irradiation after introducing a crystallization-inducing element such as nickel into the semiconductor film, and so on.

Moreover, a technique applied for flattening or modification of a surface of a semiconductor substrate or a semiconductor film is also included. A semiconductor device herein described indicates all the devices which can operate by using a semiconductor characteristic and includes electro-optic devices such as a liquid crystal display device and a light-emitting device, and also includes an electronic device having such an electro-optic device as its component.

The present invention has the following structure.

According to one structure of the present invention, a laser irradiation apparatus comprises a first laser oscillator, a second laser oscillator, a slit for blocking opposite end portions of a first laser beam emitted from the first laser oscillator, a condensing lens, means for delivering a second laser beam emitted from the second laser oscillator so as to cover the range on an irradiation surface that is irradiated with the first laser beam, means for moving the irradiation surface in a first direction relative to the first laser beam and the second laser beam, and means for moving the irradiation surface in a second direction relative to the first laser beam and the second laser beam.

According to another structure of the present invention, a laser irradiation apparatus comprises a first laser oscillator, a second laser oscillator, a diffractive optical element, a slit for blocking opposite end portions of a first laser beam emitted from the first laser oscillator, a condensing lens, means for delivering a second laser beam emitted from the second laser oscillator so as to cover the range on an irradiation surface that is irradiated with the first laser beam, means for moving the irradiation surface in a first direction relative to the first laser beam and the second laser beam, and means for moving the irradiation surface in a second direction relative to the first laser beam and the second laser beam.

According to another structure of the present invention, a first laser beam emitted from a first laser oscillator passes through a slit and a condensing lens, and then enters an irradiation surface. At the same time, a second laser beam emitted from a second laser oscillator is delivered so as to cover the first laser beam on the irradiation surface. Moreover, the first laser beam and the second laser beam are scanned relative to the irradiation surface so as to anneal the irradiation surface equally.

According to another structure of the present invention, a first laser beam emitted from a first laser oscillator passes through a diffractive optical element, a slit, and a condensing lens, and then enters an irradiation surface. At the same time, a second laser beam emitted from a second laser oscillator is delivered so as to cover the first laser beam on the irradiation surface. Moreover, the first laser beam and the second laser beam are scanned relative to the irradiation surface so as to anneal the irradiation surface equally.

In the above structure of the present invention, the condensing lens is a cylindrical lens or a spherical lens.

In the above structure of the present invention, each of the first laser oscillator and the second laser oscillator is a CW laser oscillator or a pulsed laser oscillator with a repetition rate of 10 MHz or more. The CW laser oscillator is, for example, a laser having a medium of a single-crystal YAG, $YVO_4$, YLF, $YAlO_3$, or $GdVO_4$, or a poly-crystal YAG, $Y_2O_3$, $YVO_4$, $YAlO_3$, or $GdVO_4$, each of which is added with one or plural elements selected from the group consisting of Nd, Yb, Cr, Ti, Ho, Er, Tm, and Ta as dopant. Moreover, another solid-state laser such as an alexandrite laser or a Ti:sapphire laser, or a semiconductor laser such as a GaN laser, a GaAs laser, or an InAs laser can also be used. The pulsed laser oscillator with a repetition rate of 10 MHz or more is, for example, a laser having a medium of a single-crystal YAG, $YVO_4$, or $GdVO_4$, or a poly-crystal YAG, $Y_2O_3$, $YVO_4$, $YAlO_3$, or $GdVO_4$, each of which is added with one or plural elements selected from the group consisting of Nd, Yb, Cr, Ti, Ho, Er, Tm, and Ta as dopant. The first laser oscillator and the second laser oscillator may be different kinds when they have the energy of such a degree that the laser irradiation process of the present invention can be conducted.

In the above structure of the present invention, the first laser beam is converted into a harmonic by a non-linear optical element such as BBO ($\beta$-$BaB_2O_4$, barium borate), LBO ($Li_2B_4O_7$, lithium borate), KTP ($KTiOPO_4$, kalium titanyl phosphate), $LiNbO_3$ (lithium niobate), KDP ($KH_2PO_4$, kalium dihydrogen phosphate), $LiIO_3$ (lithium iodate), ADP ($NH_4H_2PO_4$, ammonium dihydogen phosphate), BIBO ($BiB_3O_6$, bismuth triborate), CLBO ($CsLiB_6O_{10}$, cesium lithium borate), or KB5 ($KB_5O_8 \cdot 4H_2O$, potassium pentaborate).

In the above structure of the present invention, the first direction and the second direction intersect with each other. This makes it possible to irradiate the whole surface of the irradiation surface efficiently without forming the ridge while keeping the width of the beam spot constant.

In the above structure of the present invention, the first laser beam emitted from the first laser oscillator enters the irradiation surface in any direction.

In the above structure of the present invention, the second laser beam emitted from the second laser oscillator enters the irradiation surface obliquely.

In the above structure of the present invention, the beam spot of the second laser beam entirely covers the beam spot of the first laser beam on the irradiation surface.

According to the present invention, it is possible to provide a laser process apparatus which can form a semiconductor film where the diameter of the crystal grain is homogeneous and the concavity and convexity are not formed on the whole surface.

BEST MODE FOR CARRYING OUT THE INVENTION

Figure 1:
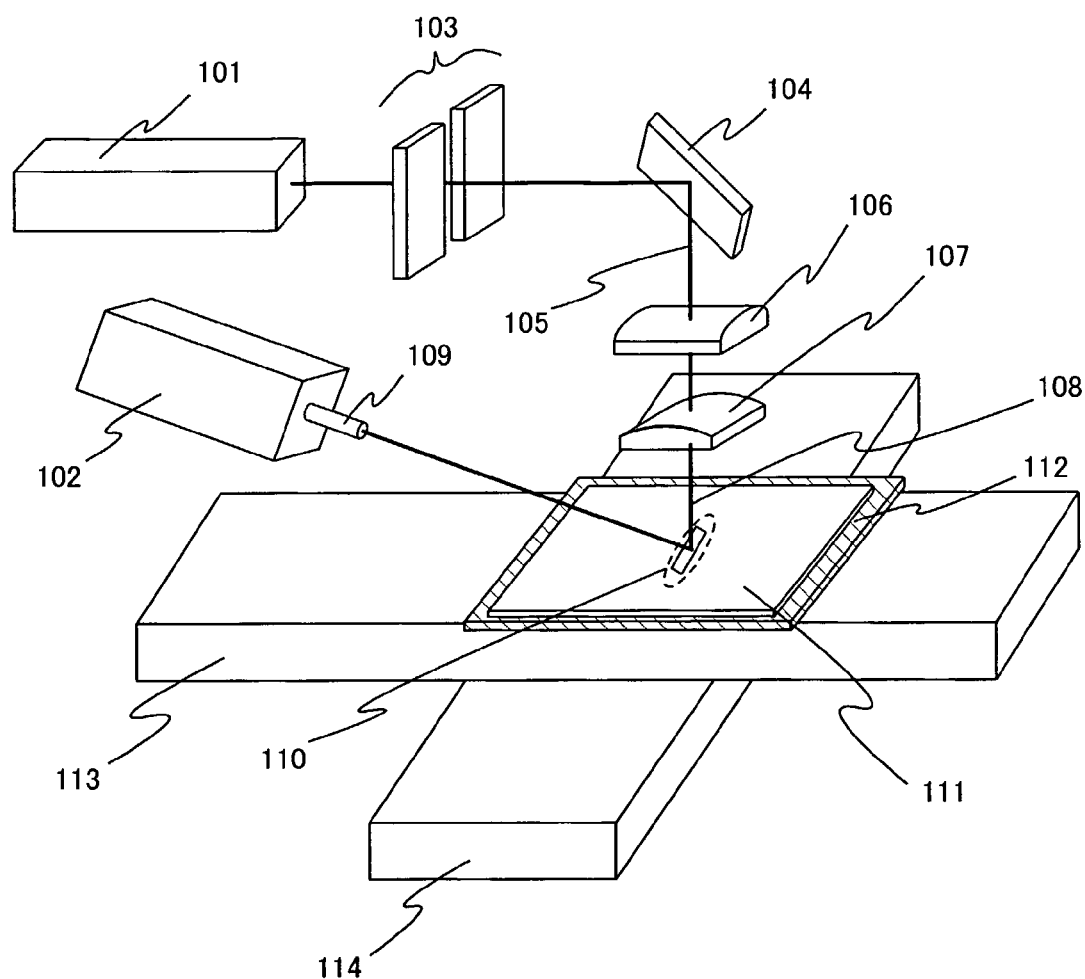
FIG. 1 schematically shows a laser irradiation apparatus according to the present invention.

Embodiment Mode and Embodiments are hereinafter described with reference to the drawings. However, since the present invention can be embodied in many different modes, it is to be understood by those skilled in the art that the mode and the detail of the present invention can be changed variously without departing from the scope of the present invention. Therefore, the present invention is not limited to the description of the following Embodiment Mode and Embodiments.

Embodiment Mode 1

This embodiment mode is described with reference to FIG. 1 and FIGS. 3A to 3F. According to the present invention, when laser annealing is conducted to a semiconductor film with a CW linear laser beam of a harmonic, opposite end portions of the CW linear beam are blocked by a slit. At the same time, a CW laser beam of the fundamental wave is delivered so that the laser beams of the harmonic and the fundamental wave overlap with each other on an irradiation surface.

Laser oscillators 101 and 102 are known CW laser oscillators. For example, a laser whose medium is a single-crystal YAG, $YVO_4$, YLF, $YAlO_3$, or $GdVO_4$, or a poly-crystal YAG, $Y_2O_3$, $YVO_4$, $YAlO_3$, or $GdVO_4$, each of which is added with one or plural elements selected from the group consisting of Nd, Yb, Cr, Ti, Ho, Er, Tm, and Ta as dopant can be used. Moreover, another solid-state laser such as an alexandrite laser or a Ti: sapphire laser or a semiconductor laser such as a GaN laser, a GaAs laser, or an IsAs laser can also be used. The laser oscillator 101 is a CW laser oscillator with $TEM_{00}$ (single transverse mode) which emits a laser beam converted into the second harmonic using a known non-linear optical element such as BBO, LBO, KTP, KDP, $LiNbO_3$, $LiIO_3$, CLBO, ATP, BIBO, or KB5. The laser oscillators 101 and 102 may be either the same kind or different kinds.

The laser beam emitted from the laser oscillator 101 passes through a slit 103. The slit 103 is provided so as to act on a major-axis direction of a linear or rectangular beam 108, thereby cutting a low-energy part of the linear or rectangular beam 108 at its opposite ends as much as possible. Simultaneously, the length of the linear or rectangular beam 108 in the major-axis direction can be adjusted. That is to say, the laser beam has the energy density distribution of FIG. 3A just after the emission from the laser oscillator; however, the laser beam has the energy density distribution shown in FIG. 3B by passing through the slit 103.

Next, the traveling direction of the laser beam is changed by a mirror 104. The direction of the laser beam which has been changed by the mirror 104 may be either perpendicular or oblique to the substrate.

After that, the linear or rectangular beam 108 is formed on the irradiation surface by cylindrical lenses 106 and 107 respectively acting on the major-axis direction and the minor-axis direction of the linear or rectangular beam 105. In this embodiment mode, the two cylindrical lenses 106 and 107 are used as condensing lenses. One of the cylindrical lenses 106 and 107 is used to shape the linear or rectangular beam in the major-axis direction, and the other is used to shape the linear or rectangular beam in the minor-axis direction. The advantage of using the cylindrical lenses 106 and 107 is that the laser beam can be condensed independently in the major-axis direction and the minor-axis direction respectively. In the case that the beam diameter, the output power, and the shape of the original beam can be used directly, two cylindrical lenses are not necessarily used. Moreover, when the laser beam is condensed while keeping the ratio between the major axis and the minor axis of the original beam, a spherical lens may be used instead of the cylindrical lenses 106 and 107. It is to be noted that cylindrical lens 106 is arranged so that the slit 103 and the irradiation surface are conjugate planes. Such the arrangement of cylindrical lens 106 prevents a diffracted light caused by which the beam passes through the slit 103 from forming an interference pattern on the irradiation surface.

The laser oscillator 102 is a CW laser oscillator which emits the fundamental wave. A laser beam emitted from the laser oscillator 102 travels through an optical fiber 109, and is delivered to an irradiation surface, thereby forming a beam spot 110. It is to be noted that the beam spot 110 is preferably large enough to cover the beam spot of the linear or rectangular beam 108. Before the irradiation of the fundamental wave, the laser beam has the energy density shown with a dotted line in FIG. 3C; however, after the irradiation of the fundamental wave, the laser beam has the energy density shown with a solid line in FIG. 3C, which is high enough to form the large crystal grain region.

A substrate 111 with a semiconductor film formed thereover is made of glass and fixed to a suction stage 112 so as not to fall during the laser irradiation. The suction stage 112 is scanned in an X-direction or a Y-direction repeatedly on a plane parallel to the surface of the semiconductor film with the use of an X-stage 113 and a Y-stage 114. Thus, the semiconductor film is crystallized. Although this embodiment mode shows a structure that the substrate 111 with the semiconductor film formed thereover is moved by using the X-stage 113 and the Y-stage 114, scanning laser beam is conducted by moving a position at which the laser beam is delivered and fixing the substrate 111; moving the substrate 111 and fixing the position at which the laser beam is delivered; or moving the position at which the laser beam is delivered and the substrate 111. The position at which the laser beam is delivered can be moved by using a galvanometer mirror, a polygon mirror and the like.

Generally, the fundamental wave having a wavelength of approximately 1000 nm is hardly absorbed in a solid-phase semiconductor film. However, the fundamental wave is easily absorbed in a liquid-phase semiconductor film because the absorption coefficient of the liquid-phase semiconductor film is 1000 times higher than that of the solid-phase semiconductor film. Therefore, in the case of delivering both the harmonic and the fundamental wave simultaneously, the fundamental wave is absorbed much only in a part of the semiconductor film which is melted by the harmonic, so that the energy given to the semiconductor film increases.

The microcrystal region is formed by opposite ends of the linear or rectangular beam 108 because the energy at the opposite ends is not enough to melt the semiconductor film completely. However, since a part of the semiconductor film is melted, the fundamental wave is absorbed in this melted part. For this reason, the energy which is not enough at the opposite ends of the linear or rectangular beam 108 can be supplied according to the present invention; therefore, a part of the semiconductor film irradiated with the harmonic can be melted completely.

When the laser annealing is conducted by using only the harmonic, the microcrystal region is formed. However, according to the present invention, the crystal can be improved so as to be the crystal similar to that formed by the central portion of the laser beam. It is to be noted that a part of the semiconductor film which is not melted by the harmonic does not absorb the fundamental wave; therefore this part of the semiconductor film is not melted.

On the whole surface of a semiconductor film obtained according to the present invention, the diameter of the crystal grain is homogeneous and the ridge is not formed. Therefore, a TFT can be manufactured even between the adjacent crystallized regions. This makes it possible to eliminate the restriction on the layout and the size and to manufacture TFTs without selecting the locations within the semiconductor film.

According to the present invention, the whole surface of the semiconductor film is annealed homogeneously. Therefore, all the TFTs manufactured using the semiconductor film formed by the present invention have superior and homogeneous characteristics.

Moreover, according to the present invention, it is no longer necessary to manufacture a mark for determining an irradiation position when irradiating a semiconductor film with a CW laser beam. Furthermore, the design rule in manufacturing a semiconductor device can be relaxed drastically.

With thus obtained semiconductor film, for example, an active matrix liquid crystal display or the like can be manufactured according to a known method.

Although this embodiment mode shows the example of using the CW laser, a pulsed laser with a repetition rate of 10 MHz or more can also be used instead of the CW laser. As the applicable laser, a laser having a repetition rate of 10 MHz or more and having a medium of a single-crystal YAG, $YVO_4$, or $GdVO_4$, or a poly-crystal YAG, $Y_2O_3$, $YVO_4$, $YAlO_3$, or $GdVO_4$, each of which is added with one or plural elements selected from the group consisting of Nd, Yb, Cr, Ti, Ho, Er, Tm, and Ta as dopant is given.

Embodiment 1

In this embodiment, a diffractive optical element (also referred to as diffractive optics or a diffractive optics element) is used to crystallize a semiconductor film more homogeneously. A harmonic of a CW laser beam is shaped into a linear or rectangular laser beam having homogeneous energy distribution with the use of the diffractive optical element, opposite end portions of this laser beam are blocked by a slit, and then the laser beam is delivered to a semiconductor film. In addition, a CW laser beam of the fundamental wave is delivered simultaneously so as to overlap the linear or rectangular beam on an irradiation surface.

A laser irradiation apparatus shown in this embodiment comprises laser oscillators 201 and 202, a diffractive optical element 203, a slit 205, a mirror 206, condensing lenses 208 and 209, a suction stage 213, an X-stage 215, and a Y-stage 216.

Figure 2:
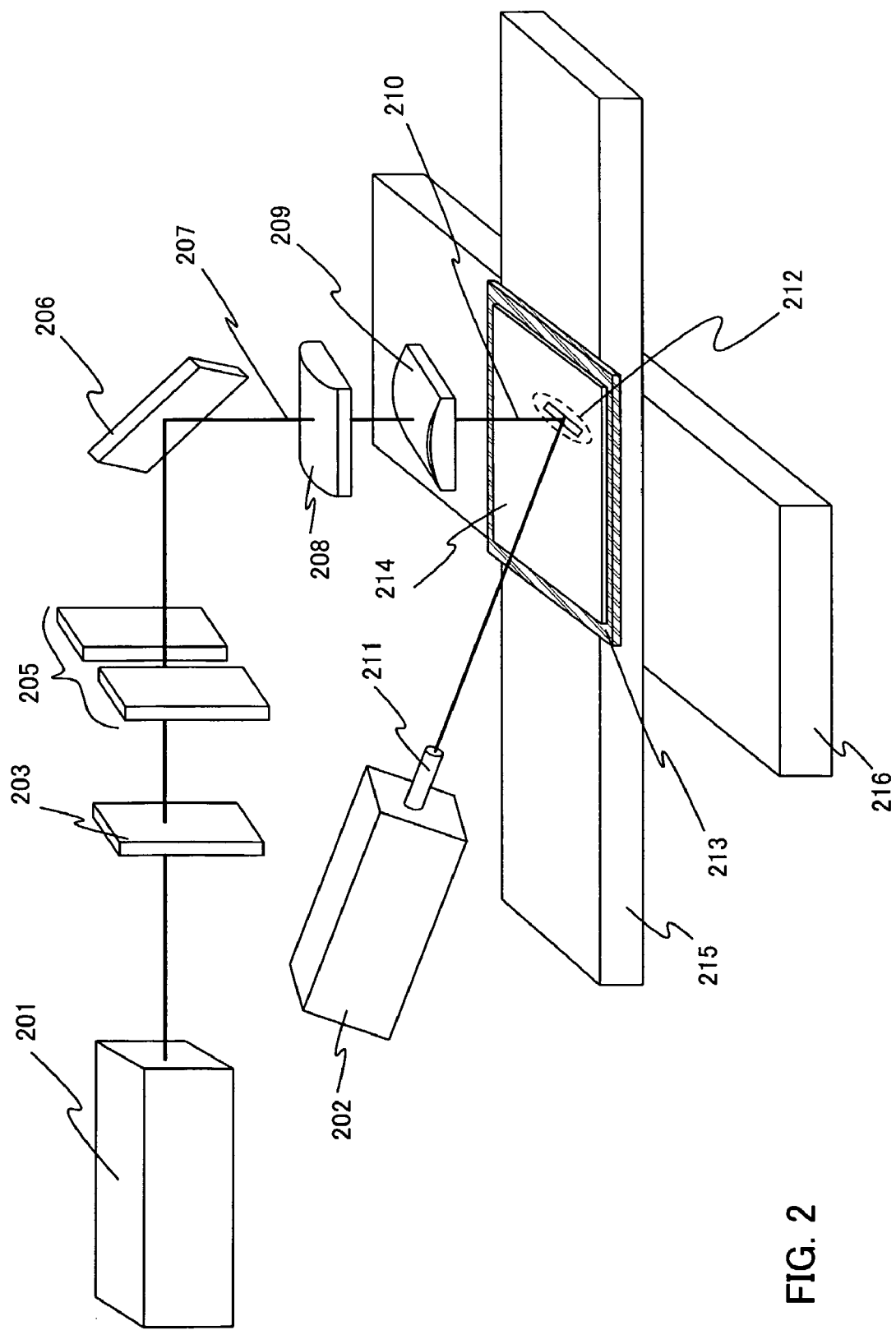
FIG. 2 schematically shows a laser irradiation apparatus according to the present invention.

FIG. 2 shows an example of the laser irradiation apparatus. First, a substrate 214 over which an amorphous semiconductor film is formed is prepared. The substrate 214 is fixed onto the suction stage 213. The suction stage 213 can be moved freely in an X-axis direction and a Y-axis direction by using the X-stage 215 and the Y-stage 216. The suction stage 213 can be moved in the X-axis direction and the Y-axis direction by various stages such as a motor stage, a ball bearing stage, and a linear motor stage.

Each of the laser oscillators 201 and 202 is a known CW laser oscillator, that is, a laser having a single-crystal YAG, $YVO_4$, YLF, $YAlO_3$, or $GdVO_4$, or a poly-crystal YAG, $Y_2O_3$, $YVO_4$, $YAlO_3$, or $GdVO_4$, each of which is added with one or plural elements selected from the group consisting of Nd, Yb, Cr, Ti, Ho, Er, Tm, and Ta as dopant. Moreover, another solid-state laser such as an alexandrite laser or a Ti:sapphire laser, or a semiconductor laser such as a GaN laser, a GaAs laser, or an InAs laser can also be used. Since the semiconductor laser is pumped by emitting light by itself, the energy efficiency is higher than the solid-state laser which is pumped by using a flash lamp. By using any one of these lasers as the laser oscillators 201 and 202, it is possible to effectively manufacture a semiconductor film having crystal grains each of which is large enough to form at least one TFT therein.

The laser oscillator 201 is a CW laser oscillator which emits a laser beam with $TEM_{00}$ (single transverse mode) which has been converted into the second harmonic using a known non-linear optical element such as BBO, LBO, KTP, KDP, $LiNbO_3$, $LiIO_3$, CLBO, ATP, BIBO, or KB5. In accordance with the condition, a laser beam emitted from the laser oscillator 201 may be converted into a harmonic other than the second harmonic by using the non-linear optical element. Moreover, the first laser oscillator 201 and the second laser oscillator 202 may be either the same kind or different kinds.

The diffractive optical element 203 is also referred to as diffractive optics or a diffractive optics element, which is an element to obtain a spectrum by using diffraction of light. The diffractive optical element 203 is a diffractive optical element having many grooves on its surface, thereby also serving as a condensing lens. With this diffractive optical element 203, the laser beam emitted from the CW laser oscillator having Gaussian energy distribution can be shaped into a linear or rectangular beam having homogeneous energy distribution.

The slit 205 is a flat-plate-like member disposed at an image-forming position of the diffractive optical element. Specifically, the slit 205 is provided at a position where the linear or rectangular beam having homogeneous energy distribution forms an image by the diffractive optical element. The summary is shown in FIGS. 3A to 3F and FIG. 4.

Figure 3A:
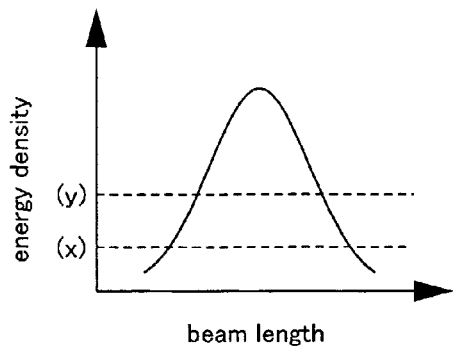
FIGS. 3A to 3F show energy density of a laser beam when applying the present invention.
Figure 3B:
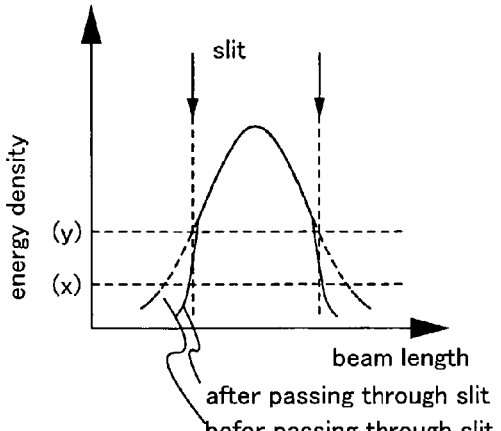
Figure 3C:
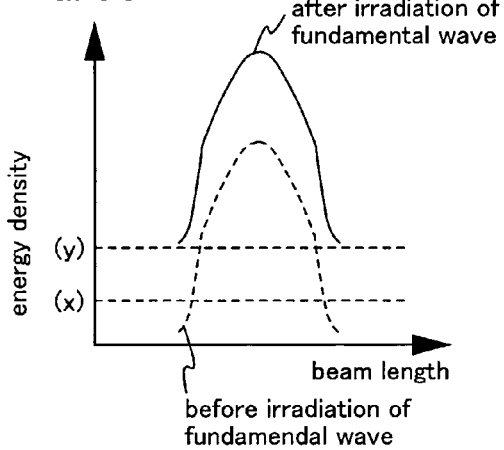
Figure 3D:
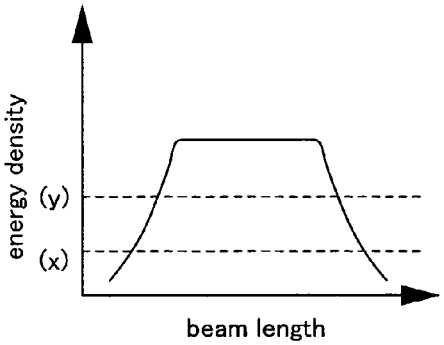
Figure 3E:
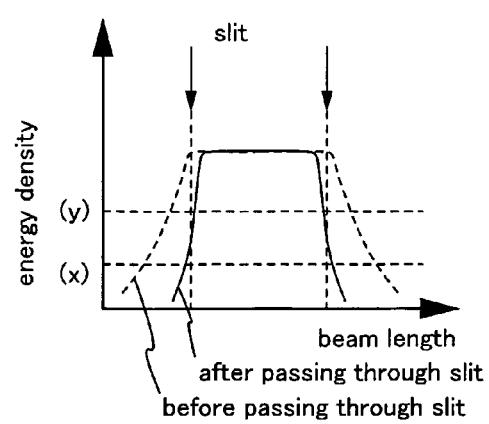
Figure 3F:
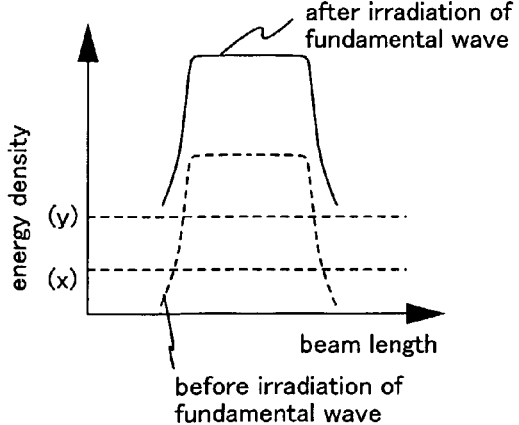
Figure 4:
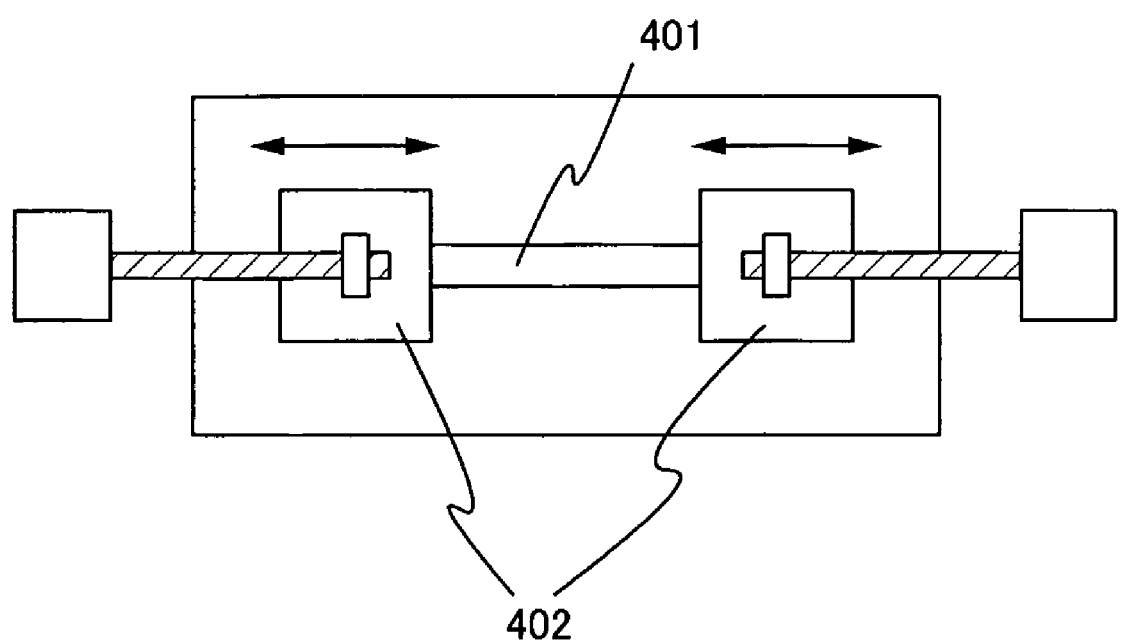
FIG. 4 schematically shows a slit used according to the present invention.

Just after the emission from the laser oscillator, the laser beam has energy density distribution shown in FIG. 3A; however, the energy density distribution thereof changes into that shown in FIG. 3A by passing through the diffractive optical element 203. That is to say, the energy distribution is homogenized in the central portion of the laser beam. However, the energy is not enough in the end portions of the laser beam; therefore, the melting is incomplete. Consequently, these end portions are blocked by using a slit shown in FIG. 4.

The slit has a rectangular slit opening portion 401 in its central portion and has blocking plates 402 in its opposite end portions in a long-side direction of the slit opening portion 401. The blocking plates 402 are opened and closed in accordance with the kind of the laser oscillator 201 which emits the harmonic so as to adjust the energy distribution.

Thus, by adjusting the blocking plates 402 at the opposite ends of the slit opening portion 401 in accordance with the kind of the laser, it is possible to cut particularly a part of the rectangular laser beam formed by the diffractive optical element that has inhomogeneous energy distribution at the opposite end portions in the long-side direction.

With such a structure, the laser beam emitted from the laser oscillator 201 is shaped into the linear or rectangular beam having homogeneous energy distribution by the diffractive optical element 203, and then forms an image at the slit 205. After that, a part of the laser beam having low energy density distribution is blocked by the slit 205, the laser beam is reflected on the mirror 206, and then becomes a linear or rectangular beam 207. Further, the laser beam is condensed by cylindrical lenses 208 and 209 to be a linear or rectangular beam 210, and enters perpendicularly or obliquely the substrate 214 with the amorphous semiconductor film formed.

At the same time, a laser beam emitted from the laser oscillator 202 travels through an optical fiber 211 and is delivered to an irradiation surface, thereby forming a beam spot 212 so as to overlap the beam spot of the linear or rectangular beam 210 on the irradiation surface. It is to be noted that, on the irradiation surface, the beam spot 212 covers the entire beam spot formed by the beam 210 and enters the irradiation surface obliquely. Before the irradiation of the fundamental wave, the laser beam has the energy density shown with a dotted line in FIG. 3F; however, the laser beam has the energy density distribution shown with a solid line in FIG. 3F by the irradiation of the fundamental wave, which is high enough to form a crystalline region having large crystal grains and gives homogeneous energy.

The substrate 214 with the semiconductor film formed is made of glass and fixed to the suction stage 213 so as not to fall during the laser irradiation. The suction stage 213 is scanned repeatedly on a plane parallel to the surface of the semiconductor film by using the X-stage 215 and the Y-stage 216.

In this embodiment, the two cylindrical lenses 208 and 209 are used as the condensing lens. The laser beam perpendicularly enters these two cylindrical lenses. Since the cylindrical lens has curvature in one direction, the laser beam can be condensed or expanded only in a one-dimensional direction. Therefore, by corresponding the directions of the curvature of the two cylindrical lenses 208 and 209 to the X-axis direction and the Y-axis direction respectively, the size of the beam spot on the irradiation surface can be changed to any degree in the X-Y directions. This makes the optical alignment easy and freedom of the alignment high. When the beam diameter, the output power, and the shape of the original laser beam emitted from the laser oscillator 201 can be used directly, the number of the cylindrical lenses may be the minimum. When the laser beam is condensed while keeping the ratio between the major axis and the minor axis of the original beam, a spherical lens may be used instead of the cylindrical lenses 208 and 209.

The linear or rectangular beam 210 entering the substrate 214 has a size of approximately 1 to 10 µm in the minor-axis direction in the case of using a laser beam with an output power of 10 W. The lower limit of the length in the minor-axis direction is approximately 1 µm because of the restriction in the optical design.

The length in the major-axis direction may be determined so that the energy density is sufficient based on the output power of the laser oscillator 201 and the length in the minor-axis direction. For example, in the case of using the laser beam with an output power of 10 W, the length in the major-axis direction becomes approximately 300 µm. The beam spot formed by the beam 210 has a linear or rectangular shape because the roughness appears on the substrate when an elliptical beam spot is scanned on the substrate.

According to the above process, the semiconductor film over the substrate 214 can be crystallized homogeneously. The present invention is not limited to the above structure but the design can be modified appropriately without departing from the scope of the present invention.

On the whole surface of the semiconductor film obtained by the present invention, the diameter of the crystal grain is homogeneous and the ridge is not formed. For this reason, a TFT can be manufactured even between the adjacent crystallized regions. This makes it possible to eliminate the restriction on the layout and the size and to manufacture TFTs without selecting the locations within the semiconductor film.

According to the present invention, the whole surface of the semiconductor film can be annealed homogeneously. Therefore, all the TFTs manufactured using the semiconductor film formed by the method of the present invention have superior and homogeneous characteristics.

Moreover, by applying the present invention, it is no longer necessary to manufacture a mark for determining an irradiation position when irradiating a semiconductor film with a CW laser beam. Furthermore, the design rule in manufacturing a semiconductor device can be relaxed drastically.

Although the CW laser of the harmonic and the CW laser of the fundamental wave are delivered so as to overlap with each other on the semiconductor film in this embodiment, a pulsed laser with a repetition rate of 10 MHz or more can be used instead of the CW laser. The applicable laser is a laser which has a repetition rate of 10 MHz or more and has a medium of a single-crystal YAG, $YVO_4$, or $GdVO_4$ or a poly-crystal YAG, $Y_2O_3$, $YVO_4$, $YAlO_3$, or $GdVO_4$, each of which is added with one or plural elements selected from the group consisting of Nd, Yb, Cr, Ti, Ho, Er, Tm, and Ta as dopant.

Embodiment 2

In this embodiment, laser beams emitted from two CW laser oscillators of a harmonic are divided and the laser beams with different energy distribution are overlapped with each other so that a laser beam having homogeneous energy distribution is formed. Moreover, after further homogenizing the energy distribution of the laser beam by blocking end portions of the laser beam with the use of a slit, the laser beam is delivered to a semiconductor film. At the same time, a CW laser beam of the fundamental wave is delivered so as to overlap the laser beam of the harmonic on an irradiation surface. This summary is described with reference to FIG. 5 and FIGS. 6A to 6C.

Reference numerals 501 and 502 denote laser oscillators. The laser oscillators 501 and 502 are known CW laser oscillators such as a laser having a medium of a single-crystal YAG, $YVO_4$, YLF, $YAlO_3$, or $GdVO_4$, or a poly-crystal YAG, $Y_2O_3$, $YVO_4$, $YAlO_3$, or $GdVO_4$, each of which is added with one or plural elements selected from the group consisting of Nd, Yb, Cr, Ti, Ho, Er, Tm, and Ta as dopant. Moreover, another solid-state laser such as an alexandrite laser or a Ti:sapphire laser, or a semiconductor laser such as a GaN laser, a GaAs laser, or an InAs laser can also be used. Since the semiconductor laser is pumped by emitting light by itself, the energy efficiency is higher than the solid-state laser which is pumped by using a flash lamp. Each of laser beams emitted from the laser oscillators 501 and 502 is converted into a harmonic by a known non-linear optical element such as BBO, LBO, KTP, KDP, $LiNbO_3$, $LiIO_3$, CLBO, ATP, BIBO, or KB5. In this embodiment, the laser oscillators 501 and 502 use CW YAG lasers and have non-linear optical elements to convert the laser beams into the second harmonics. The laser beam may be converted into a harmonic other than the second harmonic as necessary.

Reference numerals 503 and 504 denote optical isolators. When a laser beam having high reflectivity to an irradiation object perpendicularly enters the irradiation object, the laser beam reflected on the irradiation object returns along the same optical path as that when entering the irradiation object. This reflected laser beam is so-called return light. The return light is a factor causing adverse effects such as the fluctuation of the output power and repetition rate of the laser and the damage of the rod. Therefore, an element for separating the return light and the emission light is necessary. This element is referred to as an optical nonreciprocal element, and an optical isolator is its typical example. The optical isolator used here is an element which transmits light only in one direction and blocks light which travels in a direction opposite to the one direction. Since the optical system in this embodiment is arranged symmetrically, the reflection light of one emission light on the irradiation surface may affect adversely on the other emission light in the same way as the return light. Therefore, the optical isolators 503 and 504 are desirably provided.

The emitted laser beams are expanded by beam expanders 505 and 506 or beam expanders 507 and 508. It is to be noted that the beam expanders 505, 506, 507, and 508 are particularly effective when the cross-sectional shape of the laser beam emitted from the laser oscillator is small, and the beam expanders are not necessary depending on the size and the like of the laser beam. The laser beam may be expanded not only in one direction but also in two directions. It is desirable to use cylindrical lenses made of synthetic quartz glass for the beam expanders 505, 506, 507, and 508 because high transmittance can be obtained.

It is preferable that the surfaces of the beam expanders 505, 506, 507, and 508 be coated so that the transmittance to the wavelength of the used laser beam is 99% or more. Moreover, by changing the coating material on the surface of the synthetic quartz glass in accordance with the wavelength of the laser beams, the beam expanders can be applied to various laser beams.

The laser beam emitted from the beam expanders 505 and 506 or 507 and 508 is divided in two directions by a mirror 509 or 510. This is described with reference to FIGS. 6A to 6C.

Figure 6A:
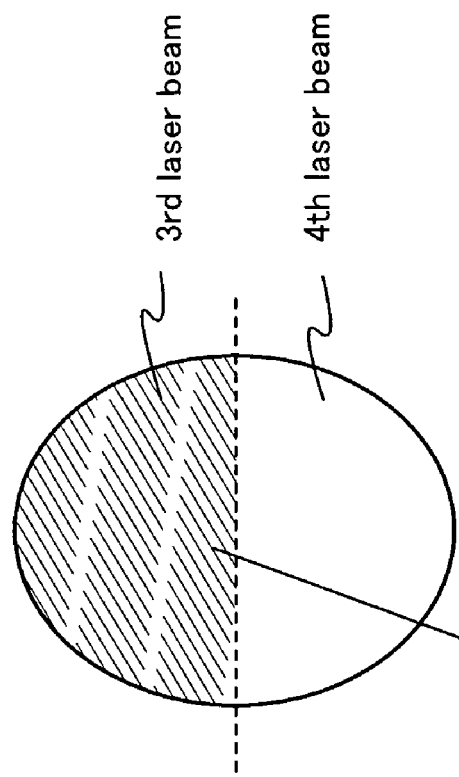
FIGS. 6A to 6C schematically show laser irradiation according to the present invention.
Figure 6B:
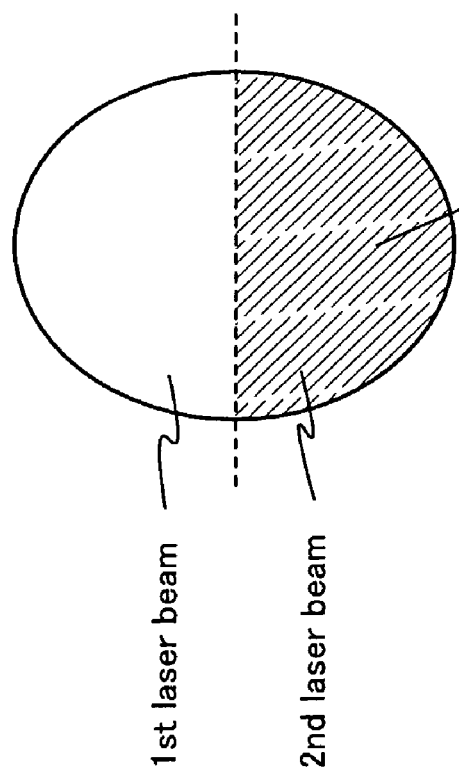

FIGS. 6A and 6B show cross-sectional shapes of laser beams taken perpendicular to the traveling direction of the laser beam. As shown in FIG. 6A, the laser beam emitted from the laser oscillator 501 is divided into a first laser beam and a second laser beam by the mirror 509. The first laser beam is absorbed in a dumper 513 and the second laser beam enters a slit 515 after reflecting on the mirror 511. In the same way, the laser beam emitted from the laser oscillator 502 is divided into a third laser beam and a fourth laser beam by the mirror 510 as shown in FIG. 6B. The third laser beam enters the slit 515 after reflecting on the mirror 512, and the fourth laser beam is absorbed in a dumper 514.

The two laser beams entering the slit 515 are emitted from different laser oscillators; therefore, the laser beams do not interfere with each other even after the laser beams are combined. Moreover, the second laser beam in the laser beam emitted from the laser oscillator 501 enters the slit 515, and the third laser beam in the laser beam emitted from the laser oscillator 502 enters the slit 515. Since the laser beams having different energy distribution are combined at the slit 515 or its vicinity, a rectangular laser beam superior in homogeneity of the energy distribution is formed (FIG. 6C).

In this embodiment, the two laser oscillators are used, and the laser beam is divided into two beams. However, the present invention is not limited to this. It is preferable to use approximately ten laser oscillators. When the number of laser oscillators to be used is small, however, it is preferable that an even number of laser oscillators be used and the laser beam be divided into an even number of laser beams. The laser oscillators are not necessarily the same kind.

Figure 6C:
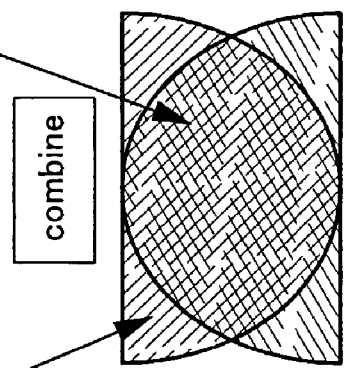

Although the laser beam is divided to have the same width in a plane perpendicular to the traveling direction of the laser beam in this embodiment as shown in FIGS. 6A to 6C, the present invention is not limited to this.

In addition, the laser beams having different energy distribution are combined at the irradiation surface or its vicinity in this embodiment. However, the combination method may be determined appropriately because the optimum combination method depends on the mode of the laser beam. For example, since a laser beam with $TEM_{00}$ mode have high symmetric properties, a laser beam having comparatively high homogeneity can be obtained by combining a left part of one of the two divided laser beams and a right part of the other. A laser beam having higher homogeneity can be obtained by dividing the laser beam into more number of laser beams. A laser beam having high homogeneity can also be obtained with another mode of the laser beam in the same method.

Figure 5:
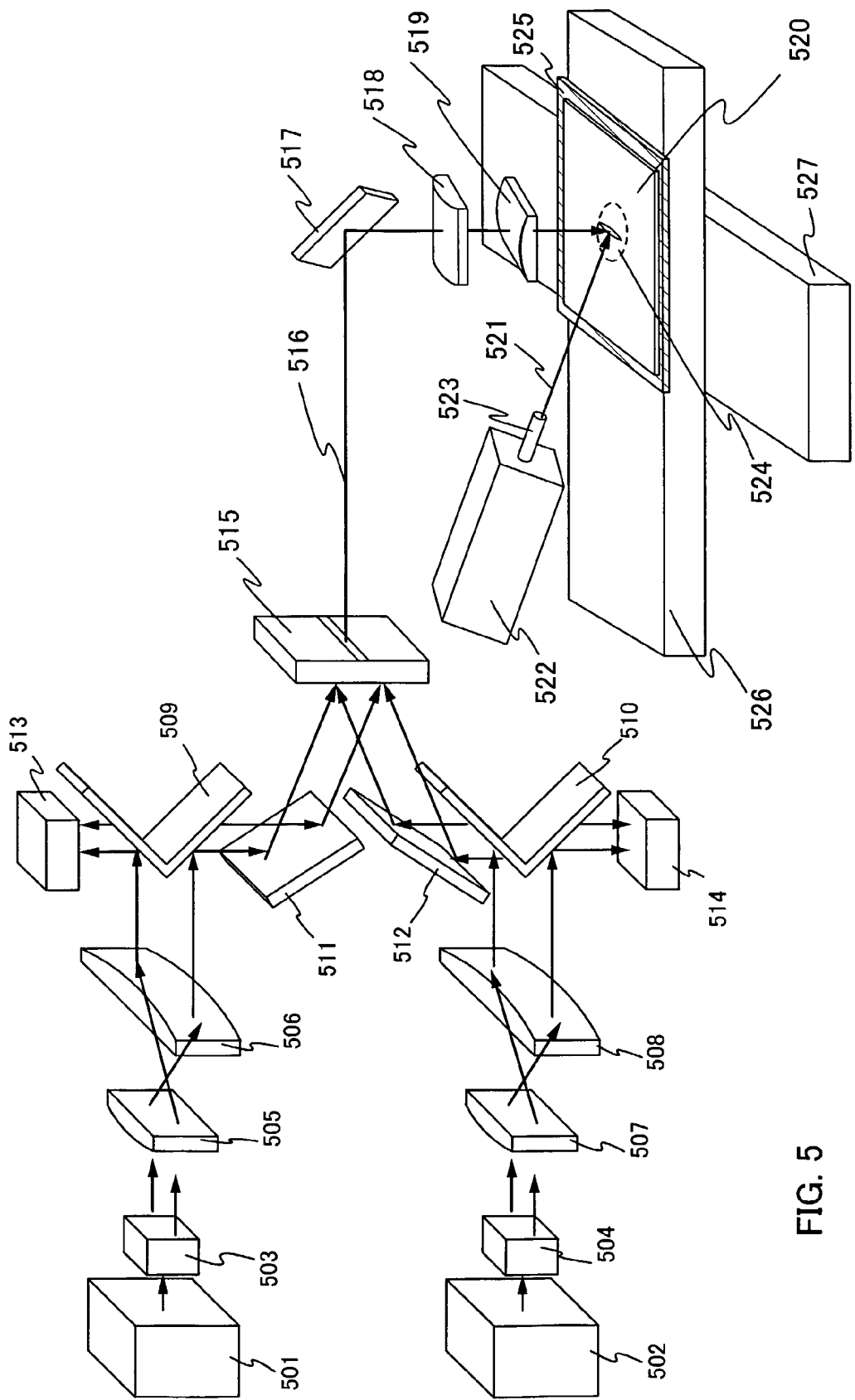
FIG. 5 schematically shows a laser irradiation apparatus according to the present invention.

A laser beam 516 having passed through the slit 515 is reflected on a mirror 517 and condensed by a cylindrical lens 518 which acts on a major axis of the laser beam 516 and a cylindrical lens 519 which acts on a minor axis of the laser beam 516, and then delivered to a substrate 520 with a semiconductor film formed. In FIG. 5, after the laser beam 516 passes through the cylindrical lens 518 acting on the major axis, the laser beam passes through the cylindrical lens 519 acting on the minor axis; however, the order is not limited to this. In this embodiment, the two cylindrical lenses 518 and 519 serve as the condensing lenses. When the laser beam is condensed while keeping the ratio between the major axis and the minor axis of the original beam, a spherical lens may be used instead of the cylindrical lenses 518 and 519.

Moreover, a CW laser beam of the fundamental wave is delivered simultaneously to the irradiation surface so as to cover a beam spot 521 formed by the laser beam 516. A laser oscillator 522 is a CW laser oscillator emitting the fundamental wave. The laser beam emitted from the laser oscillator 522 travels through an optical fiber 523 and is delivered to the irradiation surface, thereby forming a beam spot 524 so as to overlap the beam spot 521. The beam spot 524 needs to have a size which can cover the beam spot 521 completely.

The substrate 520 with the semiconductor film formed is made of glass, and fixed to a suction stage 525 so as not to fall during the laser irradiation. The suction stage 525 is scanned repeatedly in X-Y directions on a plane parallel to the surface of the semiconductor film with the use of an X-stage 526 and a Y-stage 527. Thus, the semiconductor film is crystallized.

When a semiconductor film is annealed using such a laser irradiation apparatus, an amorphous semiconductor film can be crystallized, crystallinity can be improved so as to obtain a crystalline semiconductor film, or an impurity element can be activated.

On the whole surface of a semiconductor film obtained by applying the present invention, the diameter of the crystal grain is homogeneous and the ridge is not formed. For this reason, a TFT can be manufactured even between the adjacent crystallized regions. Further, the layout and the size are not restricted, and TFTs can be manufactured without selecting the location within the semiconductor film.

According to the present invention, the whole surface of the semiconductor film is annealed homogeneously. Therefore, all the TFTs manufactured using the semiconductor film annealed by this method have superior and homogeneous characteristics.

Moreover, by applying the present invention, it is no longer necessary to manufacture a mark for determining an irradiation position when irradiating a semiconductor film with a CW laser beam. Furthermore, the design rule in manufacturing a semiconductor device can be relaxed drastically.

Although the CW laser of the harmonic and the CW laser of the fundamental wave are delivered so as to overlap with each other on the semiconductor film in this embodiment, a pulsed laser with a repetition rate of 10 MHz or more can be used instead of the CW laser. The applicable laser is a laser which has a repetition rate of 10 MHz or more and has a medium of a single-crystal YAG, $YVO_4$, or $GdVO_4$ or a poly-crystal YAG, $Y_2O_3$, $YVO_4$, $YAlO_3$, or $GdVO_4$, each of which is added with one or plural elements selected from the group consisting of Nd, Yb, Cr, Ti, Ho, Er, Tm, and Ta as dopant.

Embodiment 3

This embodiment shows a process for manufacturing a thin film transistor (TFT) using a laser annealing apparatus according to the present invention. Although this embodiment describes a method for manufacturing a top-gate (staggered type) TFT, a bottom-gate (reversely-staggered type) TFT can also employ the present invention in the same way.

Figure 7A:
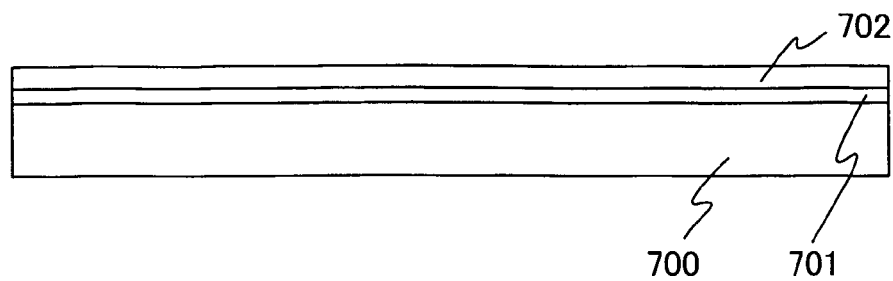
FIGS. 7A to 7D schematically show a process for manufacturing a TFT according to the present invention.

As shown in FIG. 7A, a base film 701 is formed over a substrate 700 having an insulating surface. In this embodiment, a glass substrate is used as the substrate 700. A glass substrate made of barium borosilicate glass or aluminoborosilicate glass, a quartz substrate, a ceramic substrate, a stainless steel substrate, or the like can be used as the substrate 700, for example. In addition, although a substrate made of a flexible material typified by plastic or acrylic tends to be inferior to another substrate in point of the resistance against heat, the flexible substrate can be used as long as the substrate can resist the heat in this manufacturing process.

The base film 701 is provided in order to prevent alkali-earth metal or alkali metal such as Na included in the substrate 700 from diffusing into a semiconductor. Alkali-earth metal or alkali metal causes an adverse effect on the characteristic of a semiconductor element when the metal is in a semiconductor. Therefore, the base film is formed with an insulating material such as silicon oxide, silicon nitride, or silicon nitride oxide, which can suppress the diffusion of alkali-earth metal and alkali metal into the semiconductor. The base film 701 may have either a single-layer or multilayer structure. In the present embodiment, a silicon nitride oxide film is formed in 10 to 400 nm thick by a plasma CVD (Chemical Vapor Deposition) method.

In the case of using the substrate containing even a small amount of alkali metal or alkali-earth metal such as the glass substrate or the plastic substrate as the substrate 700, it is effective to provide the base film in terms of preventing the diffusion of the impurity. When the diffusion of the impurity does not lead to any significant problems, for example when the quartz substrate is used, the base film 701 is not always necessary to be provided.

Next, an amorphous semiconductor film 702 is formed over the base film 701 in 25 to 100 nm (preferably from 30 to 60 nm) thick by a known method (a sputtering method, an LPCVD method, a plasma CVD method, or the like). Silicon, silicon germanium, or the like can be used as the amorphous semiconductor film 702. Silicon is used in this embodiment. In the case of using silicon germanium, the concentration of germanium is preferably in the range of approximately 0.01 to 4.5 atomic %.

Figure 7B:
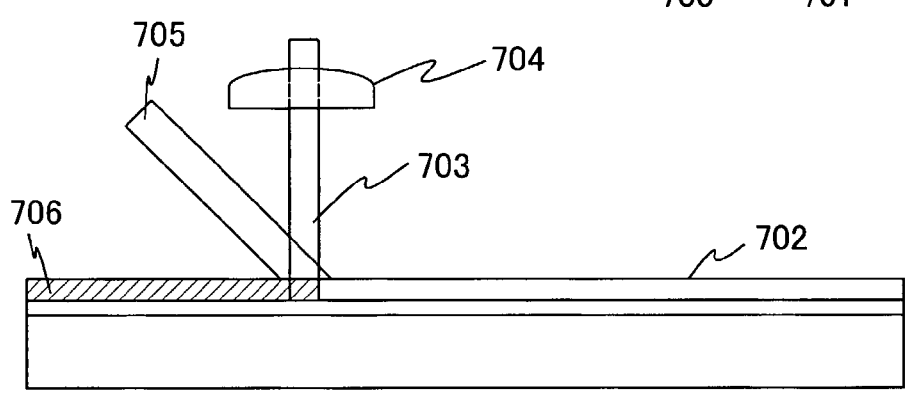

Subsequently, the amorphous semiconductor film 702 is crystallized by the irradiation with laser beams 703 and 705 using a laser annealing apparatus according to the present invention as shown in FIG. 7B. In this embodiment, the laser beam 703 is emitted from a Nd:$YVO_4$ laser providing 10 W at the second harmonic with $TEM_{00}$ mode (single transverse mode) and delivered to the irradiation surface through a spherical lens 704. The laser beam 705 is emitted from a Nd:$YVO_4$ laser providing 100 W at the fundamental wave with $TEM_{00}$ mode. The laser beam 705 is delivered so as to completely cover the beam spot of the laser beam 703.

In addition to the above-mentioned laser oscillators, a laser having a single-crystal YAG, $YVO_4$, YLF, $YAlO_3$, or $GdVO_4$, or a poly-crystal YAG, $Y_2O_3$, $YVO_4$, $YAlO_3$, or $GdVO_4$, each of which is added with one or plural elements selected from the group consisting of Nd, Yb, Cr, Ti, Ho, Er, Tm, and Ta as dopant can be used. Moreover, another solid-state laser such as an alexandrite laser or a Ti:sapphire laser, a semiconductor laser such as a GaN laser, a GaAs laser, or an InAs laser can also be used. The laser beam 703 is converted into a harmonic by a known non-linear optical element such as BBO, LBO, KTP, KDP, LiNbO$_3$, LiIO$_3$, CLBO, ATP, BIBO, or KB5. Although the laser beam 703 is converted into the second harmonic by the non-linear optical element, the laser beam may be converted into a harmonic other than the second harmonic as necessary. Since the semiconductor laser is pumped by emitting light by itself, the energy efficiency is high.

This method makes it possible not only to form the crystal grain grown continuously in the scanning direction but also to prevent the formation of the microcrystal region and the ridge at the boundary between the adjacent laser irradiation regions. Moreover, in the case of preventing the formation of the microcrystal region and the ridge for sure, it is effective to slightly overlap the adjacent regions irradiated with the harmonic.

As thus described, by annealing the semiconductor film homogeneously, the characteristics of electronic appliances manufactured with this semiconductor film can be made superior and homogeneous.

Since the low-intensity part of the laser beam can be blocked by using the slit, a linear or rectangular laser beam having predetermined intensity or more can be delivered.

Figure 7C:
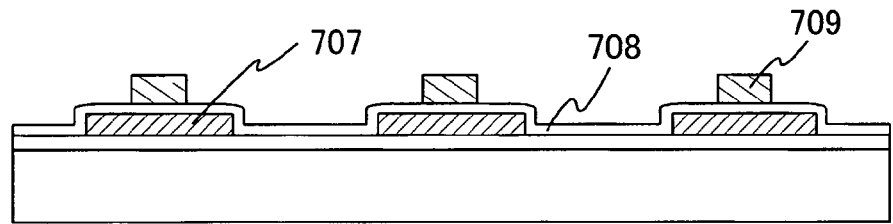

After that, a crystalline semiconductor film 706 formed by the laser irradiation is patterned, thereby forming an island-shaped semiconductor film 707 as shown in FIG. 7C. After that, a gate insulating film 708 is formed so as to cover the island-shaped semiconductor film 707. The gate insulating film 708 can be formed with silicon oxide, silicon nitride, silicon nitride oxide, or the like by a plasma CVD method or a sputtering method. In this embodiment, a silicon nitride oxide film is formed in 115 nm thick by a plasma CVD method.

Next, a conductive film is formed over the gate insulating film 708 and patterned to form a gate electrode 709. After that, an impurity element imparting n-type or p-type conductivity is selectively added to the island-shaped semiconductor film 707 by using the gate electrode 709 or patterned resist as a mask so that a source region 710, a drain region 711, an LDD region 712, and the like are formed. According to the above process, N-channel TFTs 713 and 714 and a P-channel TFT 715 can be formed over the same substrate.

Figure 7D:
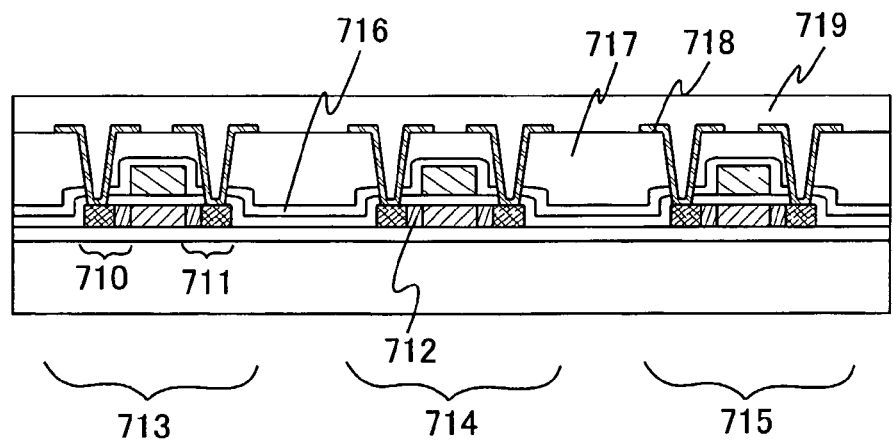

Subsequently, as shown in FIG. 7D, an insulating film 716 is formed to protect those TFTS. This insulating film 716 is formed in a single-layer or multilayer structure of a silicon nitride film or a silicon nitride oxide film in 100 to 200 nm thick by a plasma CVD method or a sputtering method. In this embodiment, a silicon oxynitride film is formed in 100 nm thick by a plasma CVD method. By the provision of the insulating film 716, a blocking effect to block the intrusion of various ionic impurities such as oxygen and moisture in the air can be obtained.

Next, an insulating film 717 is further formed. In this embodiment, an organic resin film such as polyimide, polyamide, BCB (benzocyclobutene), acrylic, or siloxane, a TOF film, an inorganic interlayer insulating film (an insulating film containing silicon such as silicon nitride or silicon oxide), a low-k (low dielectric constant) material, or the like can be used. Siloxane has a skeletal structure with a bond of silicon and oxygen and has a material containing at least hydrogen. As the substituent, an organic group containing at least hydrogen (for example, an alkyl group or aromatic hydrocarbon) is used. A fluoro group may also be used as the substituent. Alternatively, both of an organic group containing at least hydrogen and a fluoro group are applicable. Since the insulating film 717 is formed mainly for the purpose of relaxing and flattening the ridge due to the TFTs formed over the glass substrate, a film being superior in flatness is preferable.

Moreover, the insulating film and the organic insulating film are patterned by a photolithography method to form contact holes that reach the impurity regions.

Next, a conductive film is formed with a conductive material, and a wiring 718 is formed by patterning the conductive film. After that, an insulating film 719 is formed as a protective film, thereby completing a semiconductor device shown in FIG. 7D. It is to be noted that the method for manufacturing a semiconductor device using the laser annealing method of the present invention is not limited to the above method for manufacturing a TFT.

Before the laser crystallization step, a crystallization step using a catalyst element may be provided. As the catalyst element, nickel (Ni), germanium (Ge), iron (Fe), palladium (Pd), tin (Sn), lead (Pb), cobalt (Co), platinum (Pt), copper (Cu), or gold (Au) can be used. After the crystallization using the catalyst metal, the laser irradiation melts an upper part of the semiconductor film but does not melt a lower part of the semiconductor film. Therefore, a crystal remaining without being melted in the lower part of the semiconductor film becomes a crystal nucleus, and the crystallization is promoted from the lower part toward the upper part of the semiconductor film.

Therefore, it is possible to enhance the crystallinity of the semiconductor film further and to suppress the roughness of the surface of the semiconductor film after the laser crystallization, compared to the case in which the semiconductor film is crystallized only by the laser irradiation. Accordingly, the variation of the characteristics of semiconductor elements to be formed afterward typified by TFTs can be suppressed more and the off-current can be suppressed.

It is to be noted that the crystallization may be performed in such a way that after the catalyst element is added, the heat treatment is performed in order to promote the crystallization, and then the laser irradiation is conducted. Alternatively, the heat treatment may be omitted. Further, after the heat treatment, the laser process may be performed while keeping the temperature.

Although the present embodiment shows an example in which the semiconductor film is crystallized by the laser irradiation method of the present invention, the laser irradiation method may be applied to activate the impurity element doped in the semiconductor film. Moreover, the method for manufacturing a semiconductor device of the present invention can be applied to a method for manufacturing an integrated circuit and a semiconductor display device.

On the whole surface of the semiconductor film obtained by applying the present invention, the diameter of the crystal grain is homogeneous and the ridge is not formed. For this reason, a TFT can be formed even between the adjacent crystallized regions. This makes it possible to eliminate the restriction on the layout and size and to manufacture TFTs without selecting the location within the semiconductor film.

According to the present invention, the whole surface of the semiconductor film can be annealed homogeneously. Therefore, all the TFTs manufactured using the semiconductor film formed by the method of the present invention have superior and homogeneous characteristics.

Moreover, by applying the present invention, it is no longer necessary to manufacture a mark for determining an irradiation position when irradiating a semiconductor film with a CW laser. Furthermore, the design rule in manufacturing a semiconductor device can be relaxed drastically.

Although the CW laser of the harmonic and the CW laser of the fundamental wave are delivered so as to overlap with each other on the semiconductor film in this embodiment, a pulsed laser with a repetition rate of 10 MHz or more can be used instead of the CW laser. The applicable laser is a laser which has a repetition rate of 10 MHz or more and has a medium of a single-crystal YAG, $YVO_4$, YLF, $YAlO_3$, or $GdVO_4$ or a poly-crystal YAG, $Y_2O_3$, $YVO_4$, $YAlO_3$, or $GdVO_4$, each of which is added with one or plural elements selected from the group consisting of Nd, Yb, Cr, Ti, Ho, Er, Tm, and Ta as dopant.

Embodiment 4

This embodiment describes an example of a layout of TFTs manufactured by applying the present invention with reference to FIGS. 8A and 8B and FIGS. 9A to 9C.

Figure 8A:
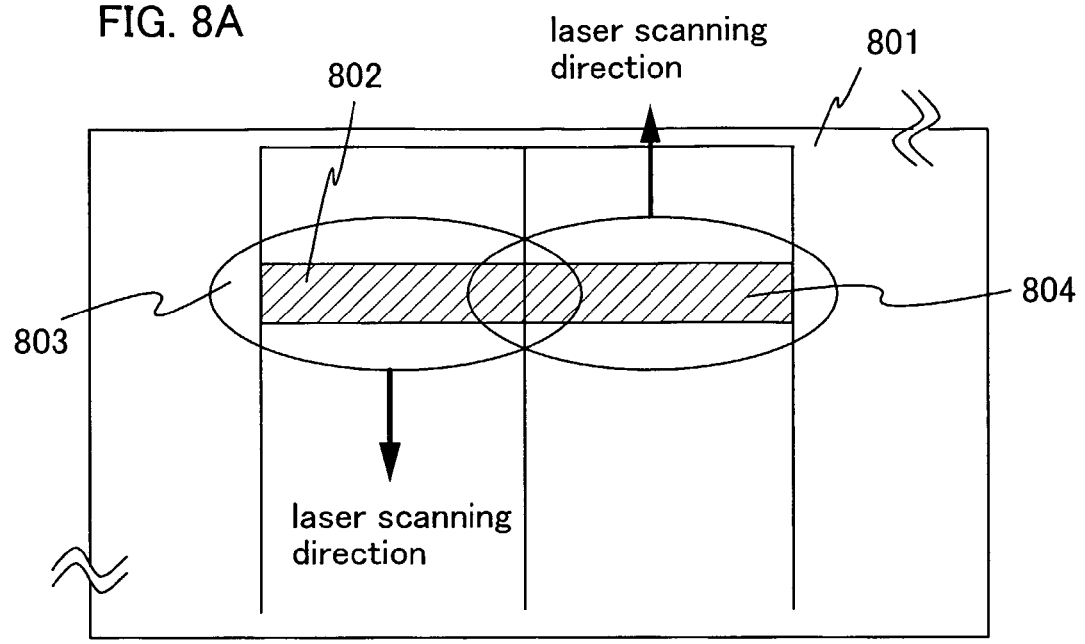
FIGS. 8A and 8B schematically show laser irradiation according to the present invention.
Figure 8B:
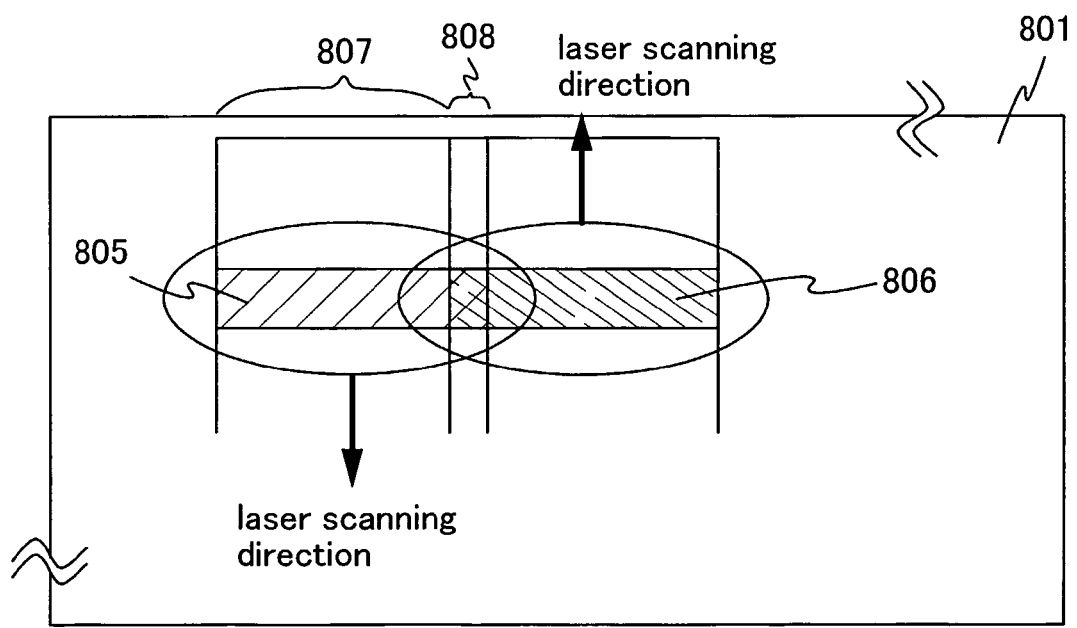

In FIGS. 8A and 8B, a reference numeral 801 denotes a semiconductor film; 802, 804, 805, and 806, beam spots of a harmonic; 803, a beam spot formed by irradiating the semiconductor film 801 with a laser beam of the fundamental wave; 807, a laser pitch; and 808, a region where the adjacent beam spots overlap with each other.

Generally, a microcrystal region and a ridge are formed at the boundary between the adjacent crystallized regions. Therefore, TFTs are not formed across the adjacent crystallized regions. However, in some cases, TFTs need to be provided in various positions because of the design. That is to say, when the degree of integration is increased in a limited area, it is necessary to dispose a TFT across the adjacent crystallized regions. However, when the TFTs are formed in this way, the crystallization state of the semiconductor film in the respective TFTs varies. Since the characteristic of an electronic appliance depends on one of the TFTs included in the electronic circuit that has the lowest mobility, this portion is a bottleneck.

However, by applying the present invention, a part of the semiconductor film irradiated with the beam spot of the harmonic is crystallized homogeneously. Therefore, the microcrystal region and the ridge are not formed at the boundary between the adjacent crystallized regions, thereby allowing free design of the layout. In FIG. 8A, the boundary between the adjacent crystallized regions corresponds to the boundary between the beam spot 802 of the harmonic and the beam spot 804 of the harmonic.

The microcrystal region and the ridge can be avoided by overlapping the adjacent beam spots of the harmonic as shown in FIG. 8B.

Figure 9A:
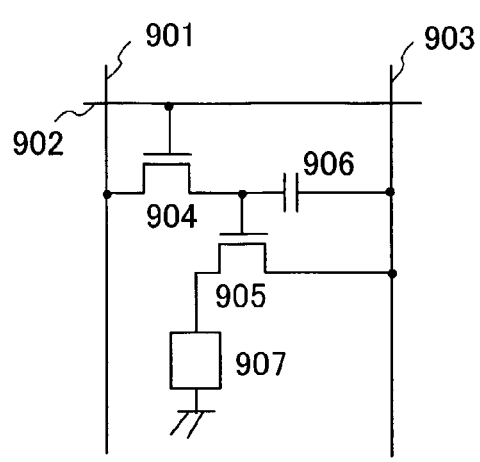
FIGS. 9A to 9C schematically show formation of a pixel according to the present invention.
Figure 9B:
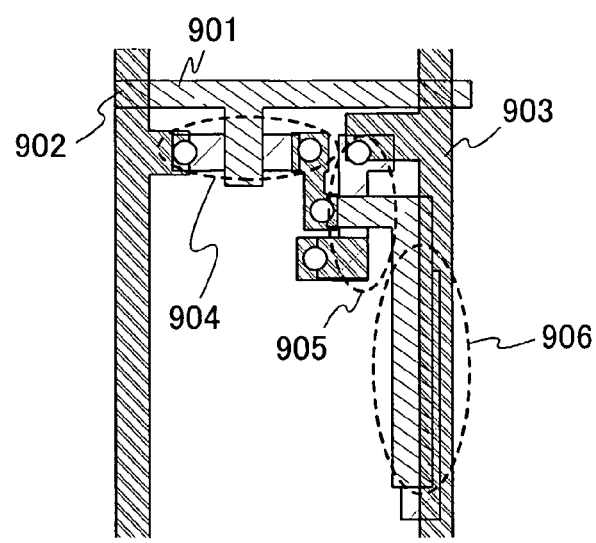
Figure 9C:
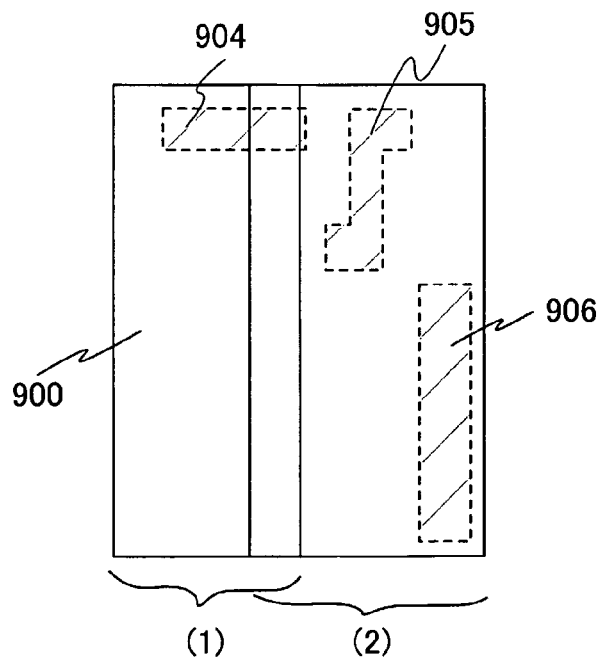

FIGS. 9A to 9C show a layout of TFTs used for a pixel of a light-emitting element, which is an example of a layout of TFTs after the laser irradiation as described in FIGS. 8A and 8B. A reference numeral 900 denotes a semiconductor film; 901, a source signal line; 902, a gate signal line; 903, a current supplying line; 904, a switching TFT; 905, a driver TFT; 906, a capacitor; and 907, a light-emitting element. The portion where (1) and (2) overlap in FIG. 9C corresponds to the region 808 in FIG. 8B where the adjacent beam spots overlap with each other.

Since the diameter of the crystal grain is homogeneous and the ridge is not formed on the whole surface of the semiconductor film by conducting the laser irradiation with the use of the laser irradiation apparatus of the present invention, it is possible to manufacture a TFT even between the adjacent crystallized regions as shown with (1) and (2) in FIG. 9C.

Thus, TFTs can be manufactured efficiently and freely not depending on the location of the boundary between the adjacent crystallized regions. It is no longer necessary to manufacture a mark for determining the irradiation position when irradiating the semiconductor film with a CW laser beam. As a result, the reduction of the cost can be achieved, and the degree of freedom in designing TFTs is increased. Furthermore, since the ridge is not formed, TFTs with high quality can be manufactured so as to have no variation of performance.

Embodiment 5

Various electronic appliances can be completed by using a semiconductor material to which laser irradiation has been conducted with the use of the present invention. According to the present invention, since the whole surface of the substrate can be annealed homogeneously, the degree of freedom in designing the layout and size of semiconductor elements and the degree of integration can be increased. Since the degree of crystallization is the same at any part of the substrate, the manufactured semiconductor elements have superior production quality and do not have the variation. The specific examples are described with the drawings.

Figure 10A:
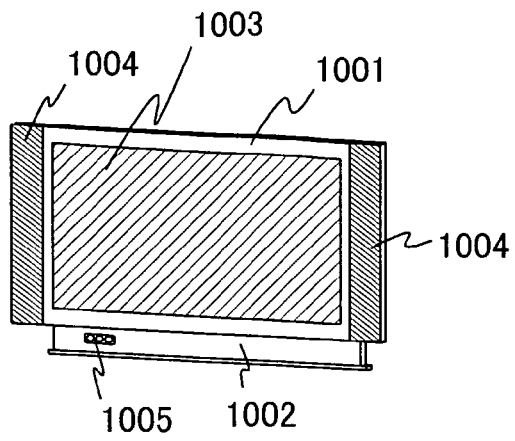
FIGS. 10A to 10E show examples of electronic appliances according to the present invention.

FIG. 10A shows a display device including a case 1001, a supporting stand 1002, a display portion 1003, speaker portions 1004, a video input terminal 1005, and the like. This display device is completed by applying thin film transistors manufactured by the manufacturing method shown in the above embodiment in the display portion 1003. The display device includes a liquid crystal display device, a light-emitting device, and the like. Specifically, all the information-displaying display devices for a computer, television reception, advertisement, and so on are included.

Figure 10B:
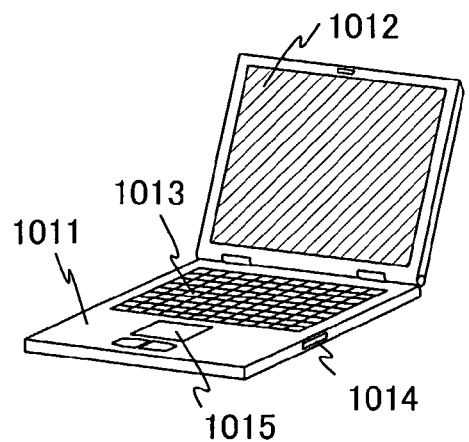

FIG. 10B shows a computer including a case 1011, a display portion 1012, a keyboard 1013, an external connection port 1014, a pointing mouse 1015, and the like. The manufacturing method shown in another embodiment can be applied to the display portion 1012, circuits, and the like. Moreover, the present invention can be applied to a semiconductor device in the main body, such as a CPU and a memory.

Figure 10C:
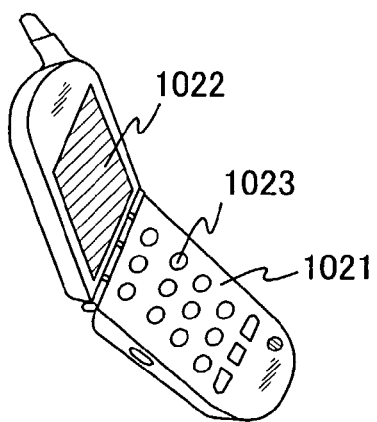

FIG. 10C shows a mobile phone, which is a typical example of a mobile terminal. This mobile phone includes a case 1021, a display portion 1022, operation keys 1023, and the like. Since, electronic appliances such as the above mobile phone, a PDA (Personal Digital Assistant), a digital camera, and a compact game machine are mobile terminals, their display screens are small. Therefore, when functional circuits such as a CPU and a memory are formed with the microscopic thin film transistors shown in another embodiment of the present invention, the appliance can be made smaller and more lightweight.

Transistors manufactured in another embodiment can be used for a thin film integrated circuit or a non-contact thin film integrated circuit device (also referred to as a radio-frequency IC tag or an RFID (Radio Frequency Identification)). By applying the manufacturing method shown in another embodiment, the thin film integrated circuit and the non-contact thin film integrated circuit can be used as a tag or a memory.

Figure 10D:
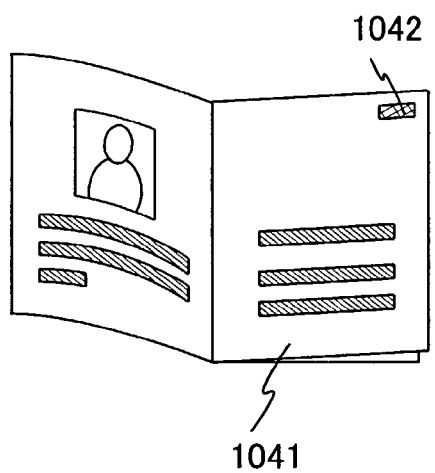

FIG. 10D shows a passport 1041 with an IC tag 1042 attached thereto. Alternatively, the IC tag 1042 may be embedded in the passport 1041. In the same way, the IC tag can be attached or embedded in a driver's license, a credit card, a banknote, a coin, a certificate, a merchandise coupon, a ticket, a traveler's check (T/C), a health insurance card, a resident card, a family register, and the like. By using the tag in this way, it is possible to distinguish the forged one and the real one.

An IC tag having a radio-frequency function can be used in the following way. At the settlement, the information that the settlement has been made is written in the radio-frequency IC tag, and the radio-frequency IC tag is checked by checking means provided at the exit whether or not the information that the settlement has been made is written in the radio-frequency IC tag. If the IC tag is brought out from the store without making the settlement, the alarm rings. With this method, forgetting of the settlement and shoplifting can be prevented.

Figure 10E:
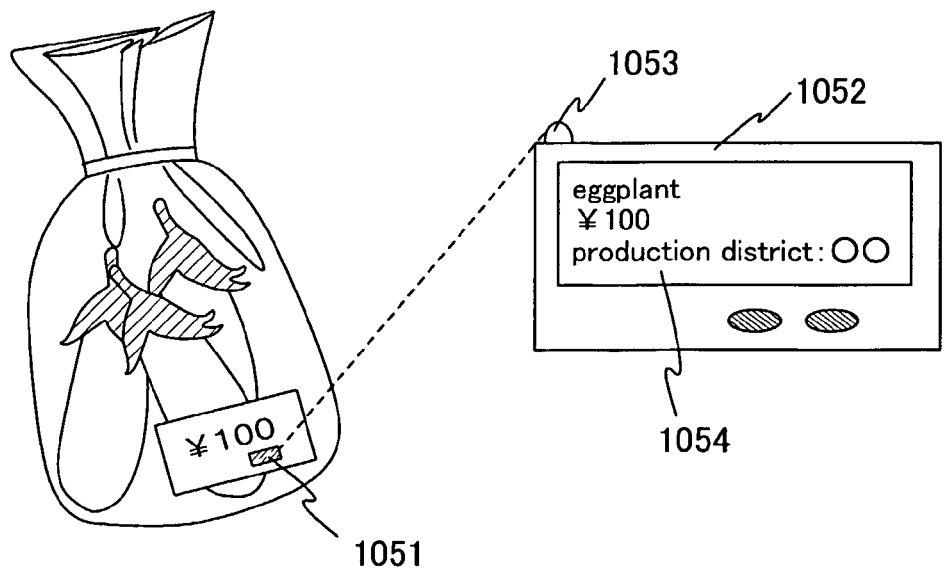
Figure 11:
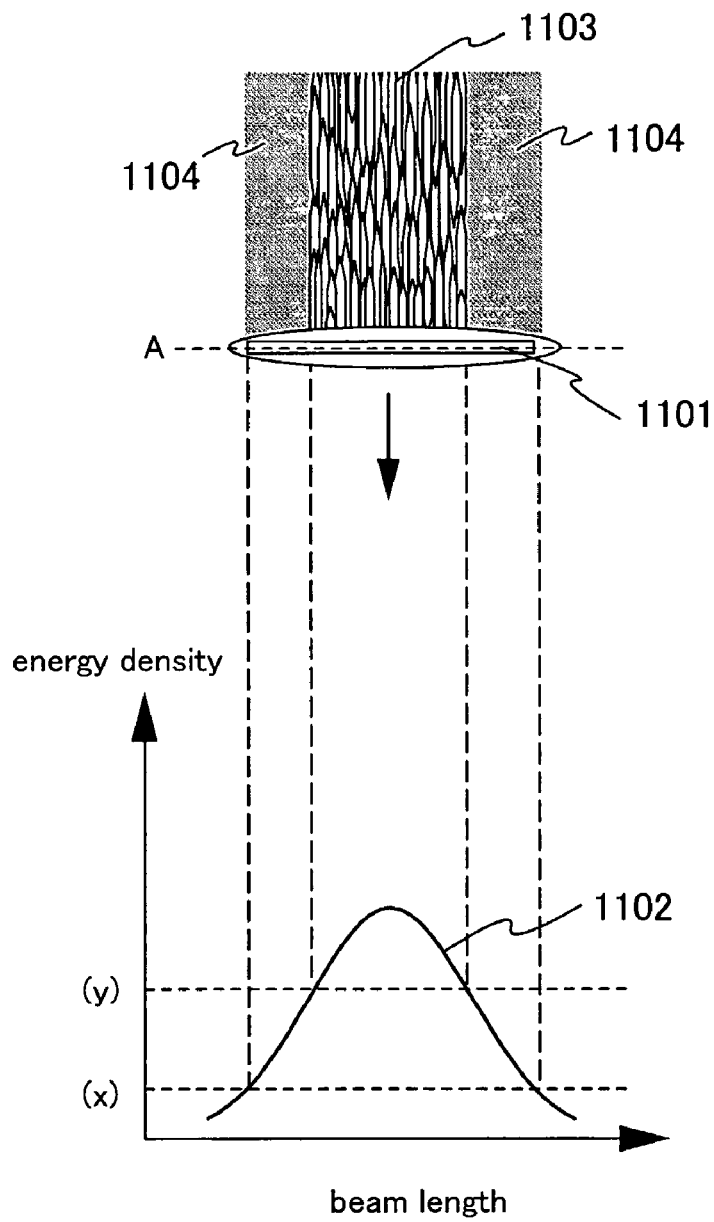
FIG. 11 shows energy density of a laser beam.

Besides, the IC tag can be used as a memory. FIG. 10E shows an example of using an IC tag 1051 for a label to be attached to a package of vegetables. Alternatively, the IC tag may be attached directly to the package or embedded in the package. In the IC tag 1051, a production area, a producer, a manufacturing date, and a process at a production stage such as a process method, a circulation process of the product, a price, quantity, an intended purpose, a shape, weight, an expiration date, each kind of authentication information, and the like can be recorded. Information from the IC tag 1051 is received by an antenna portion 1053 of a radio-frequency reader 1052 and read out, and displayed in a display portion 1054 of the reader. Thus, wholesalers, retailers, and consumers can know the information easily. Moreover, access authority can be set for each of a producer, a trader, and a consumer. Those who do not have the access authority cannot read, write, rewrite, and erase the data in the IC tag.

Since the manufacturing cost of the IC tag described above is higher than that of conventionally used barcodes, the cost reduction is required. According to the present invention, however, a semiconductor element can be formed efficiently even at the boundary between the adjacent crystallized regions, thereby being effective in the cost reduction. Further, since the ridge is not formed, the IC tags can be manufactured so as to have high quality and no variation of performance.

As thus described, the semiconductor device manufactured according to the present invention is applicable in a quite wide range, and the semiconductor device manufactured according to the present invention can be applied to electronic appliances of every field.

Embodiment 6

This embodiment describes an example to conduct crystallization more effectively by combining a crystallization method by a laser irradiation apparatus of the present invention with a crystallization method by a catalyst element.

Figure 12A:
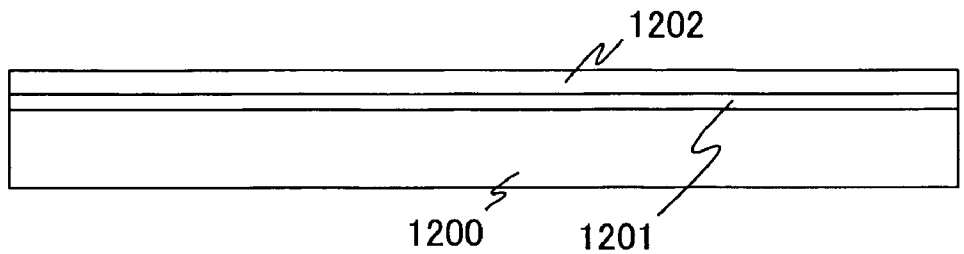
FIGS. 12A to 12D show a process of crystallizing a semiconductor film according to the present invention.
Figure 12B:
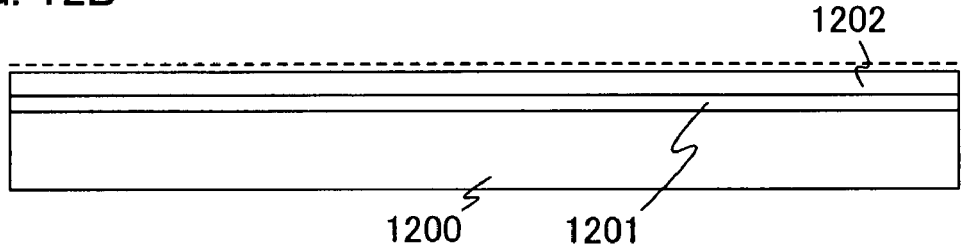

First, the process up to forming a base film 1201 over a substrate 1200 and forming a semiconductor film 1202 over the base film 1201 is performed as shown in FIG. 12A with reference to Embodiment 2. Next, as shown in FIG. 12B, a solution (a nickel acetate solution) containing Ni in the range of 10 to 100 ppm in weight is applied to the surface of the semiconductor film 1202 by a spin coating method so that a region added with nickel is formed in the surface of the semiconductor film 1202 and its the vicinity. It is noted that a dotted line in FIG. 12B shows that the catalyst element has been added. The catalyst may be added not only by the above method but also by another method such as a sputtering method, an evaporation method, or a plasma process.

Figure 12C:
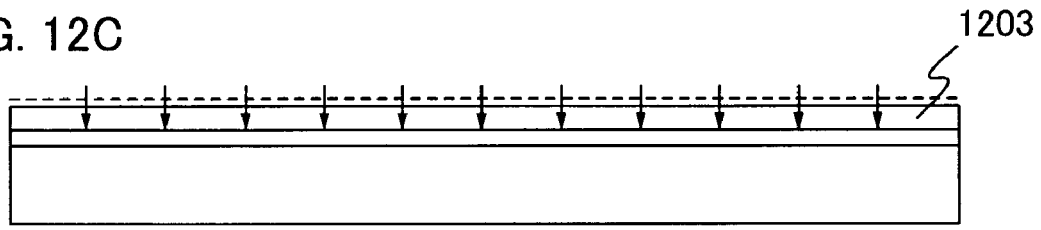
Figure 12D:
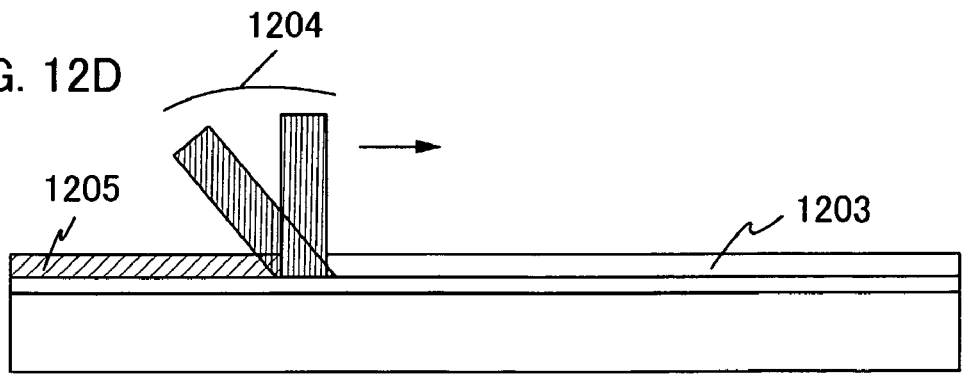

Next, the heat treatment is performed for 4 to 24 hours at 500 to 650° C., for example for 14 hours at 570° C. This heat treatment forms a semiconductor film 1203 in which the crystallization is promoted in the vertical direction as indicated by arrows, from a region added with the catalyst element toward a region not added with the catalyst element, that is, from the surface of the semiconductor film 1202 to the substrate 1200. Thus, a crystallized semiconductor film 1203 is formed (FIG. 12C).

The heat treatment may be performed at a set heat temperature of 740° C. for 180 seconds by RTA (Rapid Thermal Anneal) using radiation of a lamp as a heat source or by RTA using heated gas (gas RTA). The set temperature is the temperature of the substrate measured by a pyrometer, and the measured temperature is herein defined as the set temperature in the heat treatment. As another method, heat treatment using an annealing furnace at 550° C. for 4 hours may also be employed. It is the action of the metal element having the catalytic activity that lowers the temperature and shortens the time in the crystallization.

Although the present embodiment uses nickel (Ni) as the catalyst element, another element such as germanium (Ge), iron (Fe), palladium (Pd), tin (Sn), lead (Pb), cobalt (Co), platinum (Pt), copper (Cu), or gold (Au) may be also used.

Subsequently, the semiconductor film 1202 is irradiated with a laser beam. In the same way as another embodiment, a CW laser beam of a harmonic is emitted, opposite end portions of this laser beam is blocked by a slit, and the laser beam is shaped into a linear, rectangular, or elliptical beam by an optical system. After that, the laser beam is delivered to the semiconductor film. Alternatively, a CW laser beam of a harmonic is emitted, the energy distribution of the laser beam is homogenized by a diffractive optical element, opposite end portions of the laser beam are blocked by a slit, and the laser beam is shaped into a linear, rectangular, or elliptical laser beam by an optical system. After that, the laser beam of the harmonic is delivered to the semiconductor film. A CW laser beam of the fundamental wave is delivered to the irradiation surface so as to completely cover the beam spot of the CW laser beam of the harmonic formed on the semiconductor film. In this state, the semiconductor film is scanned relative to two laser beams 1204 so that the whole surface of the semiconductor film can be annealed homogeneously. When the crystallization is conducted according to the present invention, the diameter of the crystal grain is homogeneous and the ridge is not formed on the whole surface of the semiconductor film. In the same way as another embodiment, a pulsed laser with a repetition rate of 10 MHz or more can be used instead of the CW laser.

With the above method, a semiconductor film 1205 in which the crystallinity has been enhanced can be formed. It is considered that the semiconductor film 1205 crystallized using the catalyst element contains the catalyst element (herein Ni) at the concentration of approximately $1 \times 10^{19}$ atoms/cm$^3$. Therefore, the gettering of the catalyst element existing in the semiconductor film 1205 is performed next. Since the metal element in the semiconductor film 1205 can be removed by the gettering, the off-current can be reduced.

Figure 13A:
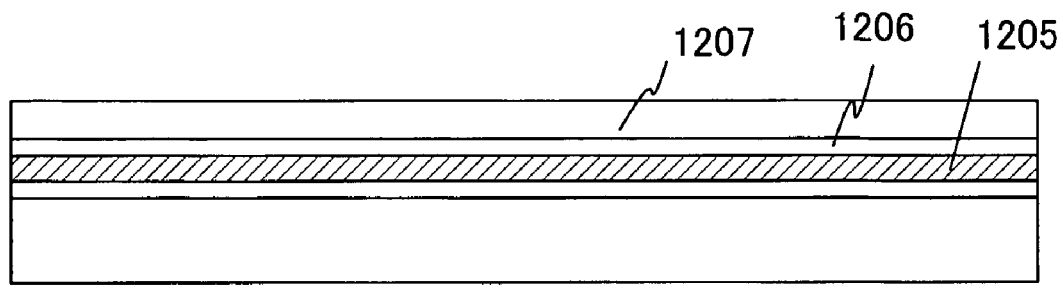
FIGS. 13A to 13C show a process of crystallizing a semiconductor film according to the present invention.

Initially, an oxide film 1206 is formed over a surface of the semiconductor film 1205 as shown in FIG. 13A. By forming the oxide film 1206 in approximately 1 to 10 nm thick, it is possible to prevent the surface of the semiconductor film 1205 from becoming rough in a later etching process. The oxide film 1206 can be formed by a known method. For example, the oxide film 1206 may be formed by oxidizing the surface of the semiconductor film 1205 using ozone water or using the solution in which a hydrogen peroxide solution is mixed with sulfuric acid, hydrochloric acid, nitric acid, or the like. Alternatively, the oxide film 1206 may be formed by a plasma process, heat treatment, ultraviolet ray irradiation, or the like in an atmosphere containing oxygen. Moreover, the oxide film 1206 may be formed separately by a plasma CVD method, a sputtering method, an evaporation method, or the like.

A semiconductor film 1207 for the gettering which contains a noble gas element at the concentration of $1\times10^{20}$ atoms/cm$^3$ or more is formed in 25 to 250 nm thick over the oxide film 1206 by a sputtering method. It is desirable that the mass density of the semiconductor film 1207 for the gettering be lower than that of the semiconductor film 1205 in order to increase the selecting ratio to the semiconductor film 1205 at the etching. As the noble gas element, one or a plurality of elements selected from the group consisting of helium (He), neon (Ne), argon (Ar), krypton (Kr), and xenon (Xe) are used.

Figure 13B:
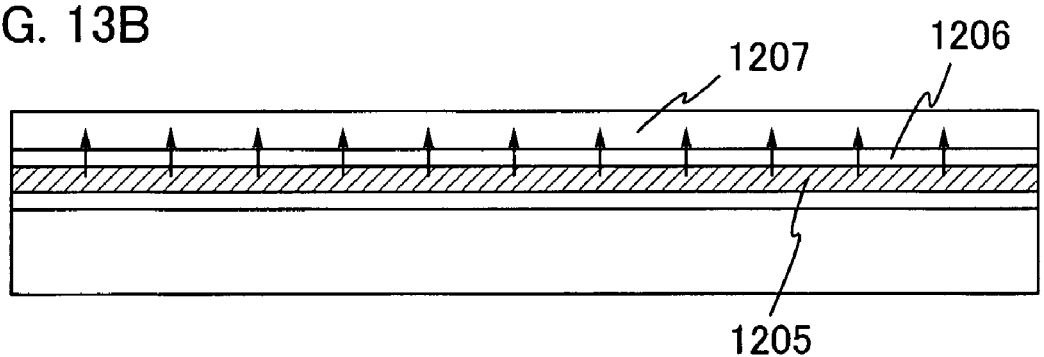

Next, the gettering is performed by heat treatment according to a furnace annealing method or an RTA method as shown in FIG. 13B. When the furnace annealing method is employed, heat treatment is performed for 0.5 hours to 12 hours at 450 to 600° C. in a nitrogen atmosphere. When the RTA method is employed, a lamp light source for heating is turned on for 1 to 60 seconds, preferably 30 to 60 seconds, which is repeated from 1 to 10 times, preferably from 2 to 6 times. The luminance intensity of the lamp light source is set so that the semiconductor film is heated instantaneously at 600 to 1000° C., preferably at approximately 700 to 750° C.

Through the heat treatment, the catalyst element inside the semiconductor film 1205 is moved to the semiconductor film 1207 for the gettering due to the diffusion as indicated by arrows, and the catalyst element is thus gettered.

Next, the semiconductor film 1207 for the gettering is removed by etching selectively. The etching process is performed by dry etching using CIF$_3$ not applying plasma or by wet etching using an alkali solution such as the solution containing hydrazine or tetraethylammonium hydroxide ((CH$_3$)$_4$NOH). On this occasion, the oxide film 1206 can prevent the semiconductor film 1205 from being etched.

Figure 13C:
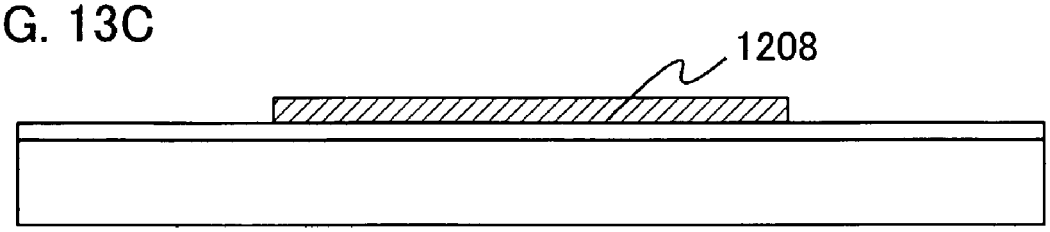

Next, after removing the oxide film 1206 by hydrofluoric acid, the semiconductor film 1205 is patterned to form an island-shaped semiconductor film 1208 (FIG. 13C). Various semiconductor elements, typically TFTs, can be formed using the island-shaped semiconductor film 1208. It is noted that the gettering method in the present invention is not limited to that shown in this embodiment. Another method may also be employed to decrease the catalyst element in the semiconductor film.

It is noted that this embodiment has described the process to promote crystallization by performing the heat treatment after the catalyst element is added and to enhance crystallinity further by the laser irradiation. However, the present invention is not limited to this, and the heat treatment may be omitted. Specifically, after adding the catalyst element, the laser irradiation may be conducted instead of the heat treatment in order to enhance the crystallinity.

Embodiment 7

In this embodiment, TFTs can be used for a thin film integrated circuit device or a non-contact thin film integrated circuit device (also referred to as a radio-frequency IC tag or an RFID (Radio Frequency Identification)). By applying the manufacturing method shown in another embodiment, the thin film integrated circuit device and the non-contact thin film integrated circuit device can be used as a tag or a memory.

By applying the present invention, a laser irradiation process can be conducted to the whole surface of the semiconductor homogeneously. Therefore, the degree of freedom of the layout and size of the semiconductor element and the degree of integration can be increased. Further, the product quality of the manufactured thin film integrated circuit device and non-contact thin film integrated circuit device is in a superior condition, thereby suppressing the variation of quality. The specific examples are described.

This embodiment shows an example of using an electrically-isolated TFT as a semiconductor element used in an integrated circuit of a radio-frequency IC tag. However, the semiconductor element applicable for the integrated circuit of the radio-frequency IC tag is not limited to the TFT but another element is also applicable. For example, a storage element, a diode, a photoelectric conversion element, a resistance element, a coil, a capacitor element, an inductor, and the like are typically given.

A method for manufacturing a radio-frequency IC tag is described with reference to the following drawings. Actually, after forming many semiconductor elements simultaneously over a substrate with a length of 1 m or more on a side, the substrate is cut into the individual semiconductor elements, which are to be sealed respectively.

Figure 14A:
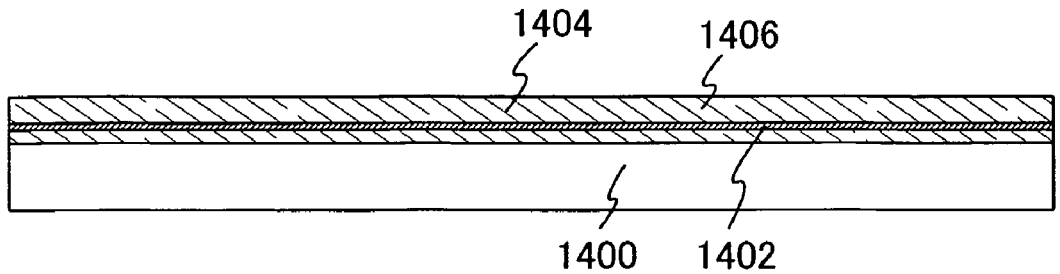
FIGS. 14A to 14D show a process of manufacturing a semiconductor device according to the present invention.

First, a first substrate 1400 is prepared as shown in FIG. 14A. The first substrate 1400 may be, for example, a glass substrate made of barium borosilicate glass or aluminoborosilicate glass, a quartz substrate, or a ceramic substrate. Moreover, a semiconductor substrate with an insulating film formed thereover may also be used. Besides, a flexible synthetic resin such as acrylic or plastic typified by polyethylene terephthalate (PET), polyethylene naphthalate (PEN), or polyether sulfone (PES) may be used. A synthetic resin can be used as a substrate as long as the synthetic resin can resist the process temperature of the manufacturing steps for a radio-frequency IC tag.

When the above material is used, the first substrate 1400 does not have a particular limitation on its size and shape. Therefore, when the first substrate 1400 has a rectangular shape and a size of, for example, 1 m or more on a side, the productivity can be increased drastically. Such an advantage is a superior point to a circular silicon substrate.

The surface of the substrate made of the above material may be flattened by being polished by a CMP method or the like. For example, a glass substrate, a quartz substrate, or a semiconductor substrate each of which has been thinned by being polished may also be used.

After preparing the first substrate 1400, an insulating film 1402 is formed over the first substrate 1400 (FIG. 14A). The insulating film 1402 can be formed in a single-layer or multilayer structure of an insulating film containing oxygen or nitrogen such as silicon oxide (SiO$_x$), silicon nitride (SiN$_x$), silicon oxynitride (SiO$_x$N$_y$) (x>y), or silicon nitride oxide (SiN$_x$O$_y$) (x>y). In this embodiment, the insulating film 1402 is formed with silicon oxynitride in 100 nm thick. The insulating film 1402 may be oxidized or nitrified by conducting a high-density plasma process.

The high-density plasma process is produced by applying a microwave at, for example, 2.45 GHz. Specifically, high-density plasma with an electron density of $10^{11}$ to $10^{13}$/cm$^3$, an electron temperature of 2 eV or less, and an ion energy of 5 eV or less is used. In the high-density plasma which is characterized by the low electron temperature as thus described, active species have low kinetic energy. Therefore, compared with the conventional plasma process, a film with little plasma damage and few defects can be formed. The plasma can be generated with a microwave-pumped plasma process apparatus which uses a radial slot antenna. The distance between the substrate 1400 and the antenna for generating the microwave is set to 20 to 80 mm (preferably 20 to 60 mm).

Next, a peeling layer 1404 is formed (FIG. 14A). The peeling layer 1404 can be formed with a metal film or formed in a multilayer structure of a metal film and a metal oxide film. The metal film is formed in a single-layer or multilayer structure of a film of an element selected from the group consisting of tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), and iridium (Ir), or a film made of an alloy material or a compound material containing the above element as its main component. These materials can be formed by a known method (a sputtering method or a CVD method such as a plasma CVD method). In this embodiment, tungsten is formed in 30 nm thick by a plasma CVD method.

When the peeling layer 1404 is formed, oxide, nitride, or nitride oxide is formed on its surface. These compounds can be peeled easily in short time because the reaction speed with etching gas, especially chlorine trifluoride ($ClF_3$) is high. That is to say, the peeling is possible when any one of the metal, the metal oxide, the metal nitride, or the metal nitride oxide is removed by etching gas.

When the oxide, the nitride, or the nitride oxide is formed on the surface of the peeling layer 1404, the chemical condition may change. For example, an oxide film containing W is formed, the valence of tungsten oxide ($WO_x$ (x=2 to 3)) changes. As a result, the oxide film is in such a state that the oxide film is easily peeled by physical means. In addition to the chemical means, such physical means can be used which can remove the oxide film more easily in short time.

After forming the peeling layer 1404, an insulating film 1406 serving as a base film is formed. Silicon oxide is formed in 200 nm thick by a sputtering method in this embodiment.

Next, a semiconductor film 1408 is formed. The semiconductor film 1408 may be an amorphous semiconductor film, a microcrystal semiconductor film, or a crystalline semiconductor film. The material of the semiconductor film is not limited in particularly; however, silicon or silicon germanium (SiGe) is preferably used. In this embodiment, an amorphous silicon film is formed in 50 nm thick. After forming the semiconductor film 1408, a step of removing hydrogen contained in the semiconductor film 1408 may be conducted. Specifically, the semiconductor film 1408 may be heated at 500° C. for an hour.

Figure 14B:
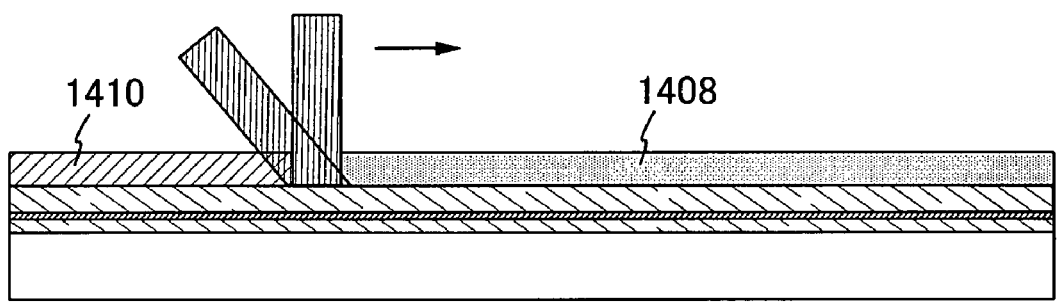

Next, the semiconductor film 1408 is crystallized by irradiating the semiconductor film 1408 with a laser beam using a laser irradiation apparatus of the present invention (FIG. 14B). In this embodiment, the irradiation is conducted by using a spherical lens and a laser beam emitted from a Nd:YVO$_4$ laser providing 10 W at the second harmonic with TEM$_{00}$ mode (single transverse mode) as a first laser beam. At the same time, a laser beam emitted from a Nd:YVO$_4$ laser providing 100 W at the fundamental wave with TEM$_{00}$ mode is delivered as a second laser beam so as to completely cover the beam spot of the first laser beam. The scanning speed is set to approximately 10 to 2000 cm/s.

In the same way as another embodiment, by passing the first laser beam through a slit, opposite end portions of the first laser beam in the major-axis direction that have low intensity are removed and, at the same time, the length of the first laser beam in the major-axis direction can be adjusted. Moreover, by overlapping the fundamental wave having high energy, which serves as the second laser beam, on the irradiation surface, the semiconductor film can be crystallized homogeneously.

Lasers applicable in this embodiment are a gas laser and a solid-state laser. The gas laser is, for example, an Ar laser, a Kr laser, or an excimer laser. The solid-state laser is, for example, a laser having a medium of a single-crystal YAG, YVO$_4$, forsterite (Mg$_2$SiO$_4$), YAlO$_3$, or GdVO$_4$ or a poly-crystal (ceramic) YAG, Y$_2$O$_3$, YVO$_4$, YAlO$_3$, or GdVO$_4$, each of which is added with one or a plurality of elements selected from the group consisting of Nd, Yb, Cr, Ti, Ho, Er, Tm, and Ta as dopant. Moreover, a glass laser, a ruby laser, an alexandrite laser, a Ti:sapphire laser, a copper vapor laser, or a gold vapor laser can be used.

A laser having a medium of a single-crystal YAG, YVO$_4$, forsterite (Mg$_2$SiO$_4$), YAlO$_3$, or GdVO$_4$ or a poly-crystal (ceramic) YAG, Y$_2$O$_3$, YVO$_4$, YAlO$_3$, or GdVO$_4$, each of which is added with one or a plurality of elements selected from the group consisting of Nd, Yb, Cr, Ti, Ho, Er, Tm, and Ta as dopant, an Ar ion laser, or a Ti:sapphire laser can emit a CW laser beam and can also emit a laser beam with a pulse repetition rate of 10 MHz or more by conducting a Q-switch operation or mode synchronization. When the laser beam is emitted at the repetition rate of 10 MHz or more, the semiconductor film is irradiated with a laser beam after the semiconductor film is melted by the previous laser beam and before the semiconductor film is solidified. Therefore, unlike the case of using a pulsed laser having low repetition rate, the interface between the solid phase and the liquid phase can be moved continuously in the semiconductor film; therefore, the crystal grain grown continuously in the scanning direction can be obtained.

When ceramic (polycrystal) is used as a laser medium, the medium can be transformed into a desired shape in short time at low cost. In the case of using a single crystal, usually a cylindrical medium having a diameter of several mm and a length of several tens mm is used. On the other hand, when ceramic is used, the size can be larger.

Since the concentration of dopant such as Nd or Yb in the medium which directly contributes to light emission cannot be changed drastically either in a single crystal or polycrystal, the increase in the output power of the laser by increasing the concentration is limited to some extent. However, in the case of using ceramic, since the size of the medium can be much larger than that of a single crystal, the drastic increase in the output power can be expected.

Moreover, in the case of ceramic, a medium having a parallelepiped shape or a cuboid shape can be easily formed. When the oscillated light zigzags inside the medium having such a shape, the optical path of the oscillated light can be made longer. Therefore, the light is amplified greatly to allow the oscillation with high output power. Since a laser beam emitted from the medium of such a shape has a rectangular cross-sectional shape at the emission, the laser beam is advantageous in transforming into a linear shape compared with a circular beam. By shaping the thus emitted laser beam using an optical system, a linear beam with a length of 1 mm or less in its minor axis and a length of several mm to several m in its major axis can be obtained easily. Moreover, by irradiating the medium with pumped light homogeneously, the linear beam has homogeneous energy distribution in the major-axis direction.

The crystallization can be conducted more effectively when the laser crystallization method of this embodiment is combined with a crystallization method using a metal element for inducing the crystallization, such as nickel (Ni), germanium (Ge), iron (Fe), palladium (Pd), tin (Sn), lead (Pb), cobalt (Co), platinum (Pt), copper (Cu), or gold (Au).

Figure 14C:
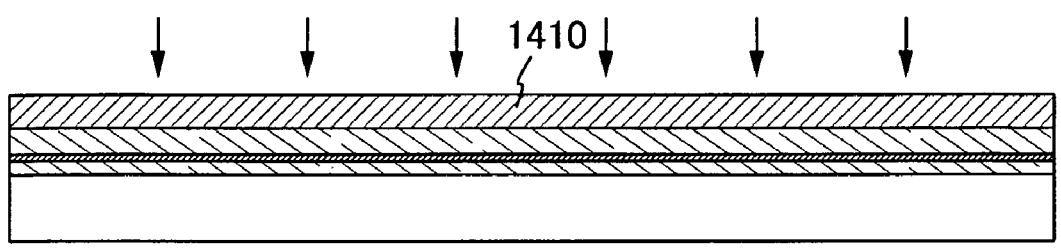

A crystalline semiconductor film 1410 formed thus is doped with an impurity element imparting P-type conductivity. Here, boron (B) is added as the impurity element (FIG. 14C).

Figure 14D:
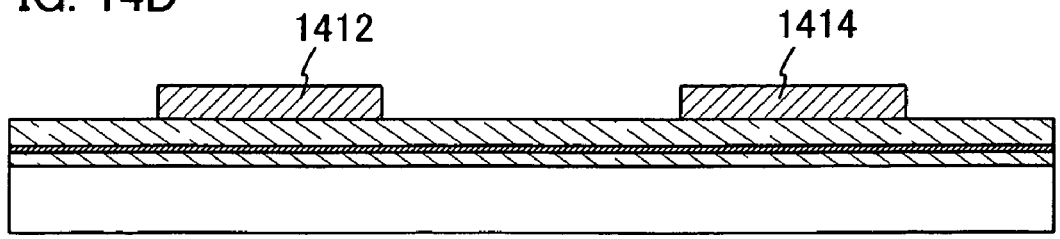

Next, the crystalline semiconductor film 1410 is etched selectively, thereby forming a first semiconductor film 1412 and a second semiconductor film 1414 (FIG. 14D).

Figure 15A:
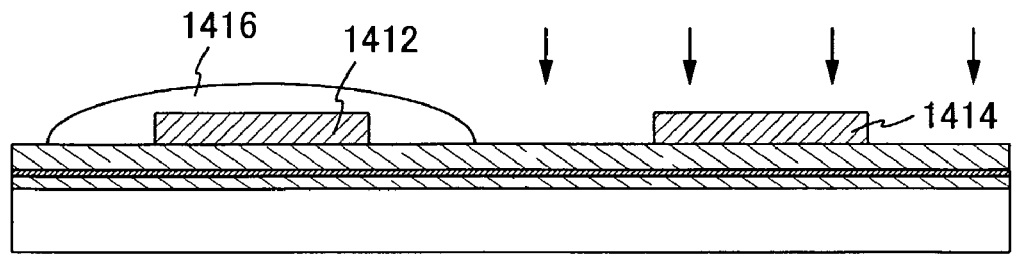
FIGS. 15A to 15D show a process of manufacturing a semiconductor device according to the present invention.

Next, after a resist mask 1416 is formed so as to cover the first semiconductor film 1412, the second semiconductor film 1414 is doped with an impurity element imparting P-type conductivity (FIG. 15A). In this embodiment, boron (B) is added as the impurity element.

Figure 15B:
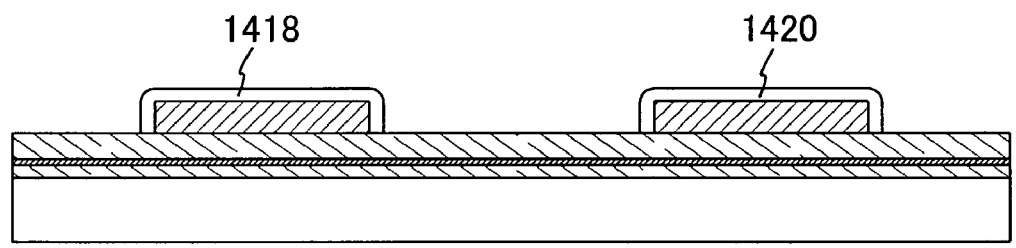

Next, the resist mask 1416 is removed, and the first semiconductor film 1412 and the second semiconductor film 1414 are oxidized or nitrified by a plasma process so that first insulating films 1418 and 1420 (an oxide film or a nitride film) are formed on the surfaces of the first semiconductor film 1412 and the second semiconductor film 1414 (FIG. 15B). In this embodiment, the plasma process is conducted in an atmosphere containing oxygen to oxidize the first semiconductor film 1412 and the second semiconductor film 1414, thereby forming silicon oxide ($SiO_x$) as the first insulating film 1418. In the case of forming silicon nitride as the first insulating films 1418 and 1420, the plasma process may be conducted in a nitrogen atmosphere. Generally, since a silicon oxide film or a silicon oxynitride film formed by a CVD method or a sputtering method contains a defect inside the film, the film quality is not high enough. Therefore, an insulating film, which is denser than the insulating film formed by a CVD method, a sputtering method, or the like, can be formed over the first semiconductor film 1412 and the second semiconductor film 1414 by conducting a plasma process in an oxygen atmosphere to oxidize the surfaces of the first semiconductor film 1412 and the second semiconductor film 1414. When a conductive film is provided over the first semiconductor film 1412 and the second semiconductor film 1414 via the insulating film formed by a CVD method, a sputtering method, or the like, there is a risk that the coverage defect may occur due to the break by the step of the insulating film at the end portions of the first semiconductor film 1412 and the second semiconductor film 1414, which results in that the semiconductor film and the conductive film short out, for example. However, when the surfaces of the first semiconductor film 1412 and the second semiconductor film 1414 are oxidized or nitrified by a plasma process, the coverage defect of the insulating film at the end portions of the first semiconductor film 1412 and the second semiconductor film 1414 can be suppressed.

Subsequently, a second insulating film 1422 is formed so as to cover the first insulating films 1418 and 1420. The second insulating film 1422 is formed with silicon nitride ($SiN_x$) or silicon nitride oxide ($SiN_xO_y$) (x>y). In this embodiment, the insulating film 1422 is formed with silicon nitride in 4 to 20 nm thick (FIG. 15C).

Figure 15C:
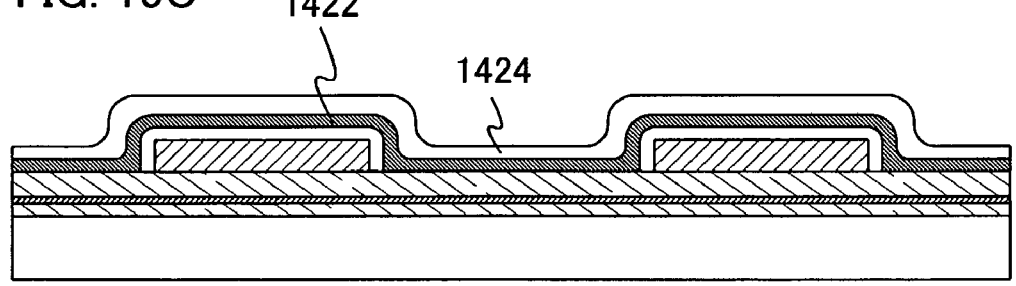

Next, the surface of the second insulating film 1422 is oxidized by a plasma process in an oxygen atmosphere to form a third insulating film 1424 (FIG. 15C). The plasma process can be conducted under the condition mentioned above. Here, a silicon oxide film or a silicon oxynitride film is formed in 2 to 10 nm thick as the third insulating film 1424 on the surface of the second insulating film 1422 by the plasma process.

Figure 15D:
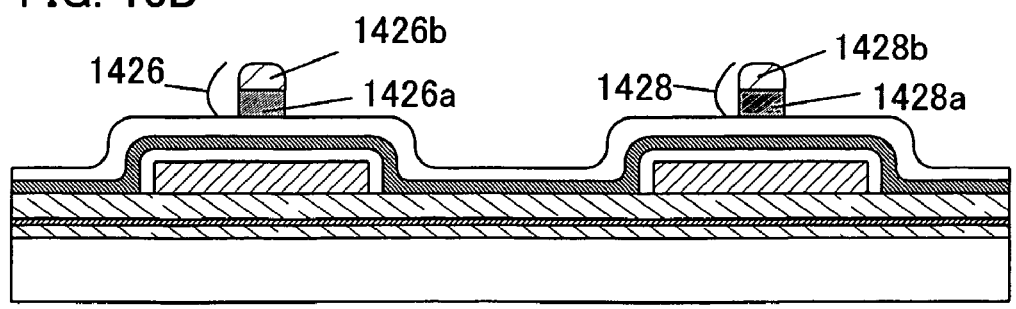

Next, conductive films 1426 and 1428 serving as gate electrodes are formed above the first semiconductor film 1412 and the second semiconductor film 1414 (FIG. 15D). In this embodiment, the conductive films 1426 and 1428 are formed to have a multilayer structure of first conductive films 1426*a* and 1428*a* and second conductive films 1426*b* and 1428*b*. Here, the first conductive films 1426*a* and 1428*a* are formed with tantalum nitride and the second conductive films 1426*b* and 1428*b* are formed with tungsten. The conductive film used for the gate electrode may have a single-layer structure. The material for the conductive film is not limited to the above materials, but alloy containing one or a plurality of elements selected from the group consisting of tantalum (Ta), tungsten (W), titanium (Ti), molybdenum (Mo), aluminum (Al), copper (Cu), chromium (Cr), and niobium (Nb), or a compound containing these elements can be used. Further, a semiconductor material typified by poly-crystalline silicon doped with an impurity element such as phosphorus can also be used.

Next, an impurity element imparting P-type conductivity is introduced into the first semiconductor film 1412 using the conductive film 1426 as a mask, and an impurity element imparting N-type conductivity is introduced into the second semiconductor film 1414 using the conductive film 1428 as a mask. With this step, a source region and a drain region are formed. After that, an insulating film 1430 is formed so as to cover the conductive films 1426 and 1428 (FIG. 16A).

Figure 16A:
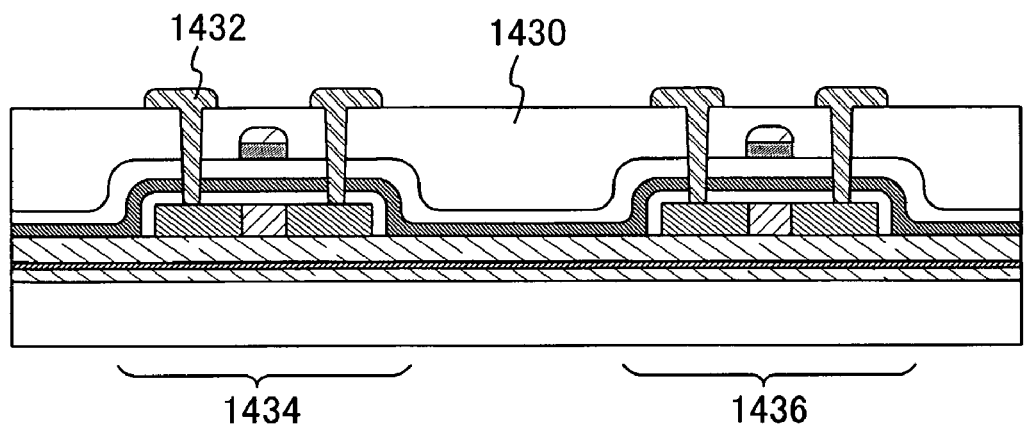
FIGS. 16A and 16B show a process of manufacturing a semiconductor device according to the present invention.

A conductive film 1432 is formed over the insulating film 1430 so as to connect electrically with the source or drain region of the first semiconductor film 1412, whereby a P-type thin film transistor 1434 using the first semiconductor film 1412 as a channel-forming region and an N-type thin film transistor 1436 using the second semiconductor film 1414 as a channel-forming region are provided (FIG. 16A). Although this embodiment shows an example of manufacturing a top-gate (staggered) TFT, the present invention is also applicable in the case of manufacturing a bottom-gate (reversely-staggered) TFT.

Figure 19A:
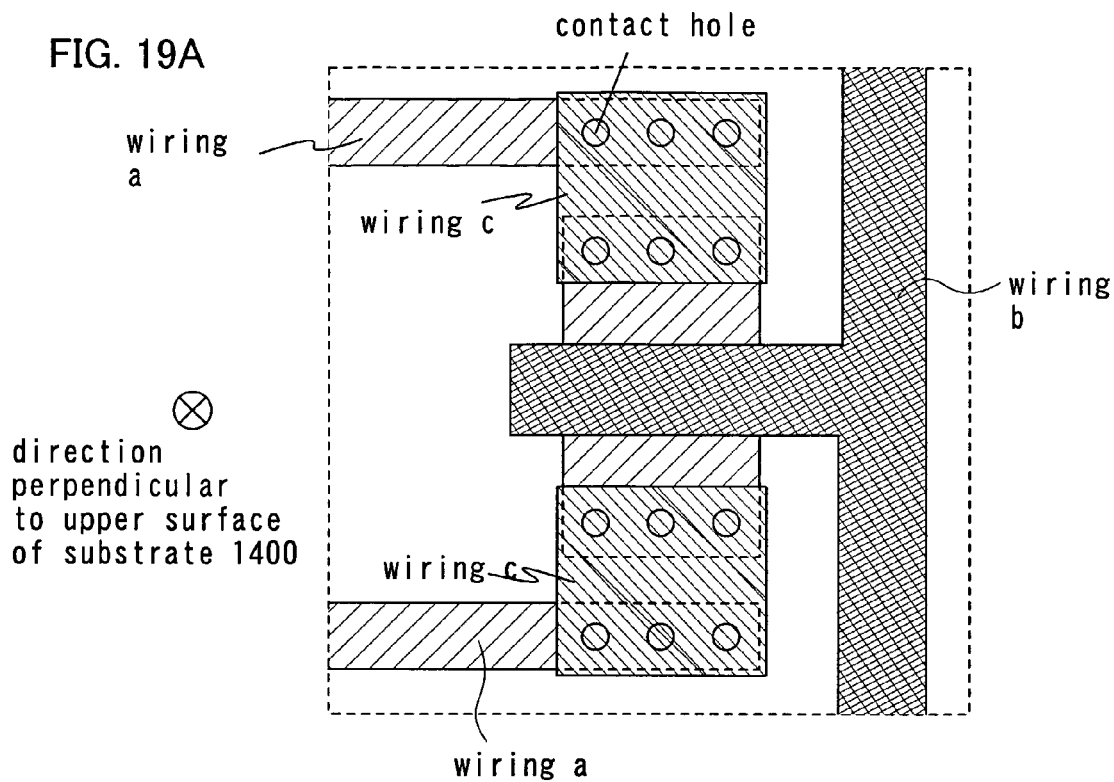
FIGS. 19A and 19B show a process of manufacturing a semiconductor device according to the present invention.
Figure 19B:
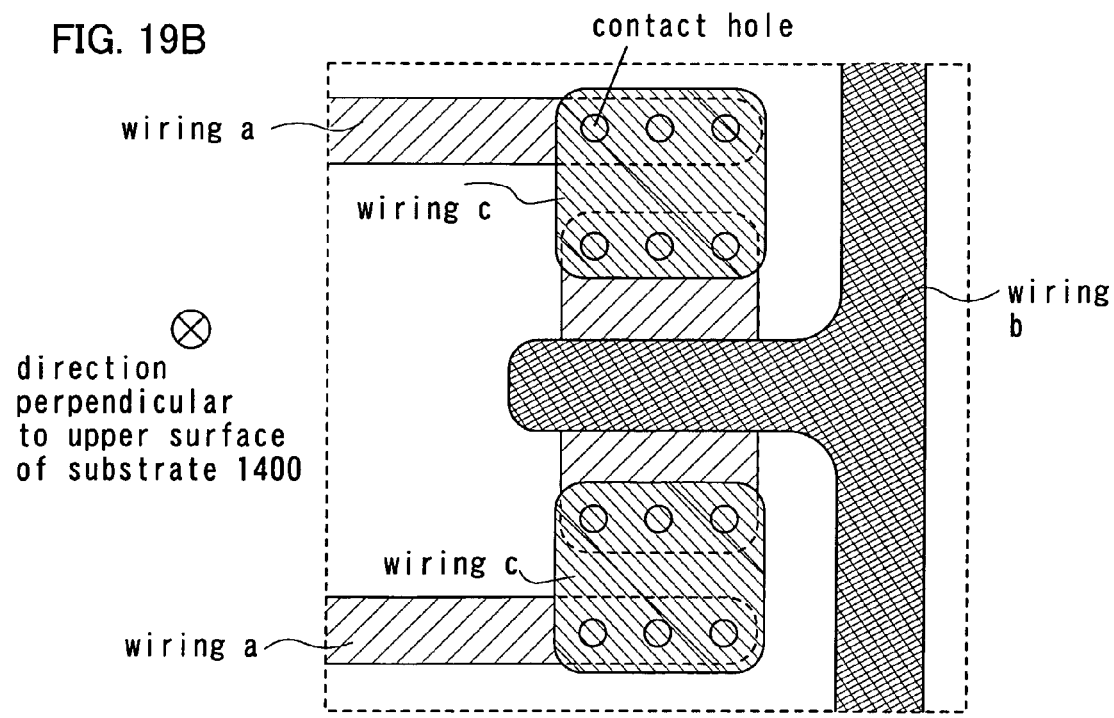

Here, it is preferable that the first semiconductor film 1412, the second semiconductor film 1414, and the conductive film 1432 (that is, a wiring) formed at the same time as these semiconductor films have round edge portions when viewed from above the substrate 1400. FIGS. 19A and 19B schematically show the state where the edges of the wiring and the like are rounded.

FIG. 19A shows a conventional forming method, while FIG. 19B shows a state that the edges of the wiring and the semiconductor films are rounded. When the edge portions are rounded as shown in FIG. 19B, it is possible to suppress that the dust generated at the formation of the wiring is left at the edge portions of the wiring. Therefore, the defect of semiconductor devices by the dust can be decreased, thereby increasing the yield.

Figure 16B:
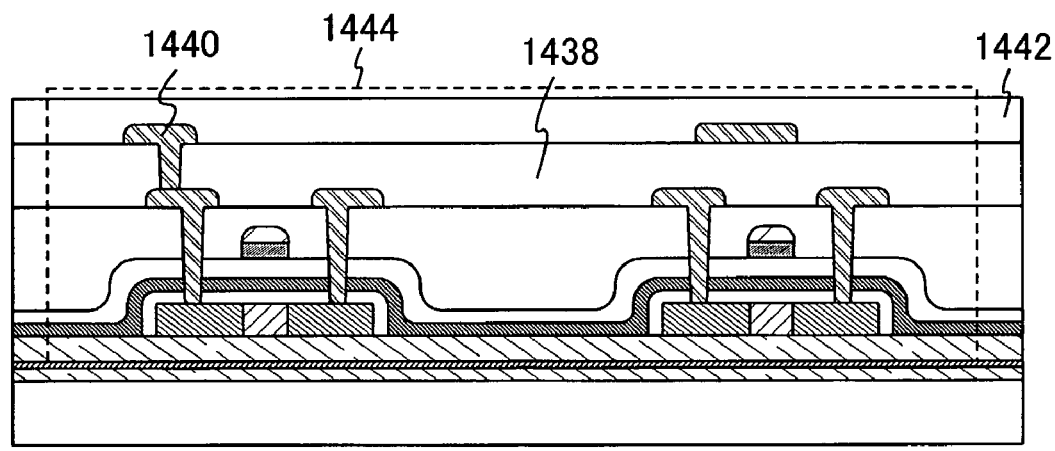

Next, an insulating film 1438 is formed so as to cover the conductive film 1432, and a conductive film 1440 serving as an antenna is formed over this insulating film 1438. Further, an insulating film 1442 is formed to cover the conductive film 1440 (FIG. 16B). It is to be noted that the conductive film 1430 and the like (a region surrounded by a dotted line) provided above the thin film transistors 1434 and 1436 are generically referred to as an element group 1444.

Each of the insulating films 1430, 1438, and 1442 may have either a single-layer or multilayer structure and may use either the same material or different materials. As the material, (1) an insulating film containing oxygen or nitrogen such as silicon oxide ($SiO_x$), silicon nitride ($SiN_x$), silicon oxynitride ($SiO_xN_y$) (x>y), or silicon nitride oxide ($SiN_xO_y$) (x>y), (2) a film containing carbon such as DLC (diamond-like carbon), or (3) a film of an organic material such as epoxy, polyimide, polyamide, polyvinylphenol, benzocyclobutene, or acrylic or a siloxane material can be used.

Since the materials given in the above (3) can be formed by a spin-coating method, a droplet-discharging method, a printing method, or the like, the flattening can be conducted effectively and the process time can be shortened. Moreover, the insulating films 1430, 1438, and 1442 can be oxidized or nitrified by a plasma process.

The conductive film 1440 can be formed with a conductive material containing one or a plurality of elements selected from the group consisting of copper (Cu), aluminum (Al), silver (Ag), gold (Au), chromium (Cr), molybdenum (Mo), titanium (Ti), tantalum (Ta), tungsten (W), nickel (Ni), carbon, and a metal compound containing the above metal element.

Figure 17A:
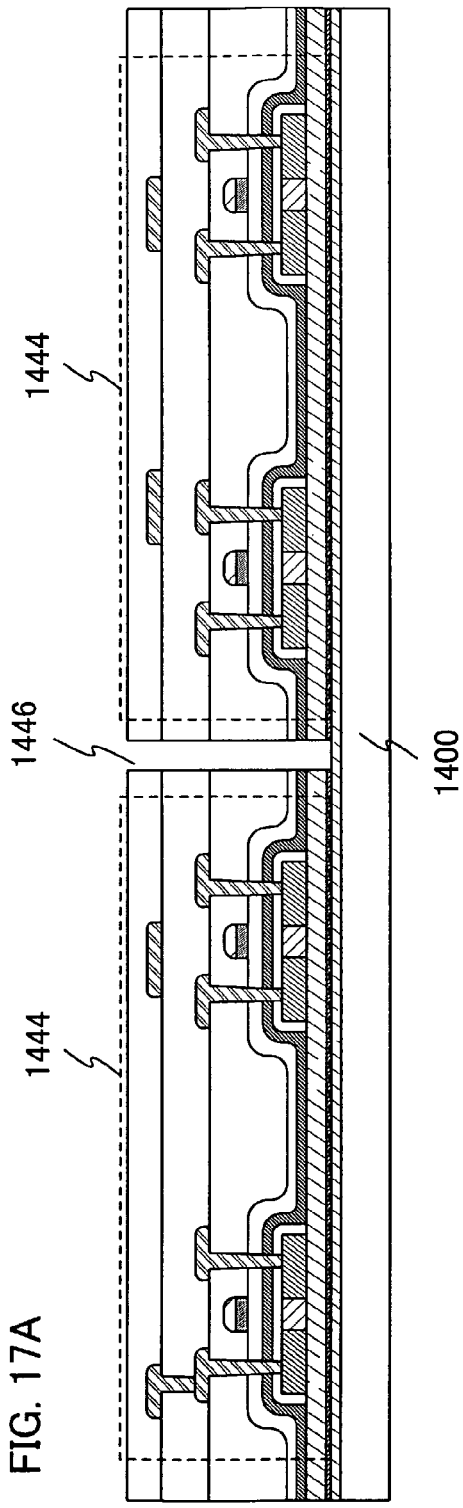
FIGS. 17A and 17B show a process of manufacturing a semiconductor device according to the present invention.

Next, an opening portion 1446 is formed in a region other than the element group 1444 by a laser irradiation method or the like so as to expose the peeling layer 1404. Etchant is introduced from this opening portion 1446 to remove the peeling layer 1404 (FIG. 17A). The peeling layer 1404 may be removed completely or may be partially left. When the peeling layer 1404 is left, the thin film transistors 1434 and 1436 can be held over the substrate 1400 even after removing the peeling layer 1404 by the etchant, and moreover, the transistors can be treated easily in the following step. The etchant is, for example, gas or liquid which contains halogen or halogen fluoride such as chlorine trifluoride. For example, $CF_4$, $SF_6$, $NF_3$, $F_2$, or the like can be used.

Figure 17B:
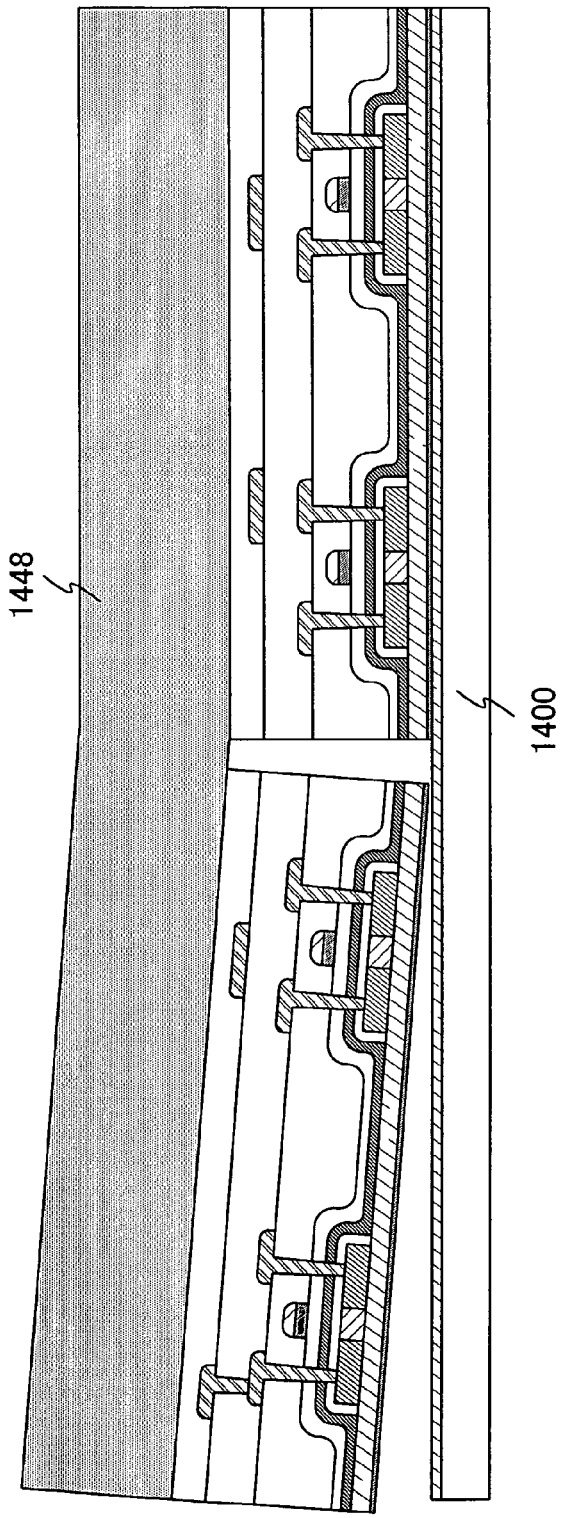

Next, a first sheet material 1448 having adhesiveness is adhered to the insulating film 1442, thereby peeling the element group 1444 from the substrate 1400 (FIG. 17B).

The purpose of adhering the first sheet material 1448 is to hold the mechanical strength of the element group 1444 to be peeled in the following step. For this reason, the thickness of the first sheet material 1448 is preferably 50 μm or more. A flexible film having a sticking agent at least on one surface thereof can be used for the first sheet material 1448. As an example of the first sheet material 1448, a material having polyester as a base and having a sticking agent on an adhesive surface can be used. The sticking agent may be, for example, a resin material containing an acrylic resin or the like or a material containing a synthetic rubber material.

Figure 18A:
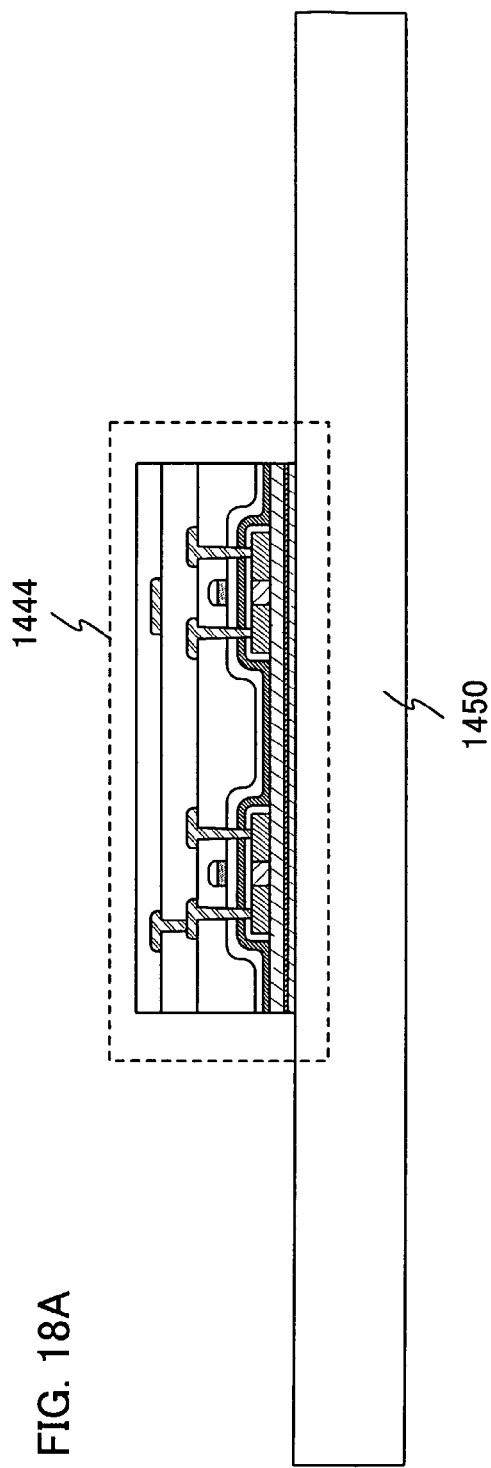
FIGS. 18A and 18B show a process of manufacturing a semiconductor device according to the present invention.
Figure 18B:
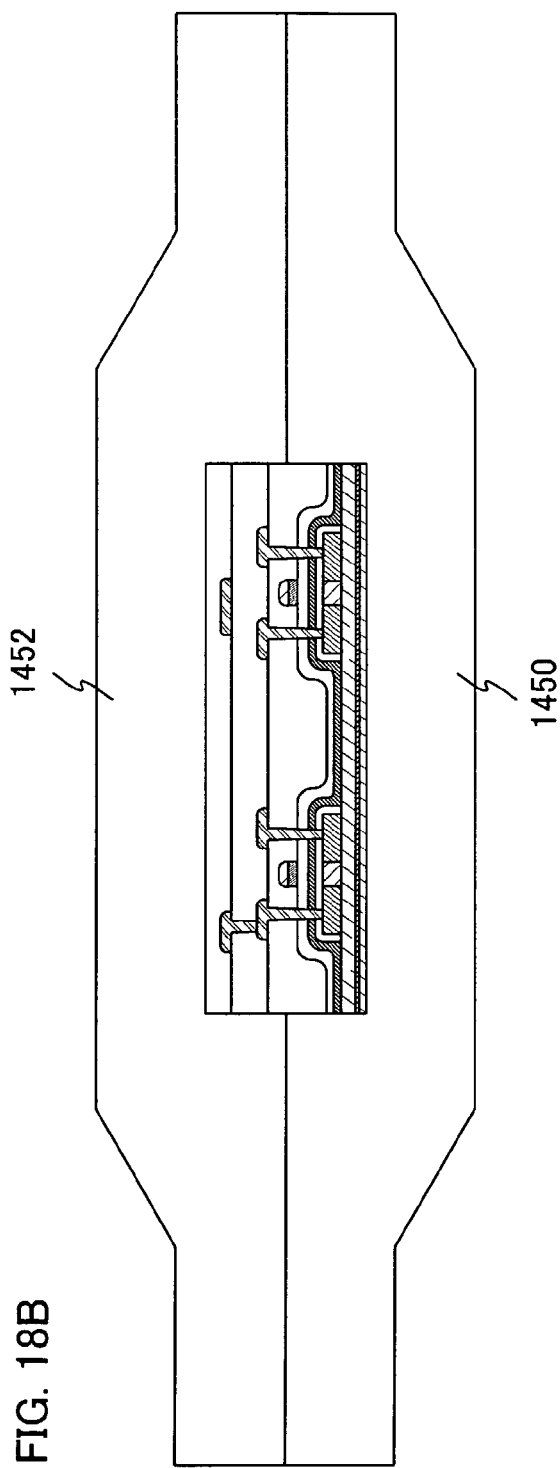

Next, the element group 1444 which has been peeled is sealed with a flexible film. Here, the element group 1444 is pasted to a second sheet material 1450 and the element group 1444 is sealed by further using a third sheet material 1452 (FIGS. 18A and 18B).

The second sheet material 1450 and the third sheet material 1452 can be a flexible film, such as a film of polypropylene, polyester, vinyl, polyvinyl fluoride, or vinyl chloride, paper, a multilayer film of a base film (polyester, polyamide, an inorganic deposition film, paper, or the like) and an adhesive synthetic resin film (an acrylic synthetic resin, an epoxy synthetic resin, or the like) or the like. A heat process and a pressurizing process are conducted to the process object by thermocompressing the process object. At the heat process and the pressurizing process, an adhesive layer provided on an outermost surface of the film or a layer provided on the outermost surface (not the adhesive layer) are melted by the heat process and adhered by the pressurization. In the case of sealing the element-forming layer with the first sheet material 1448 and the second sheet material 1450, the first sheet material 1448 may also be formed with the same material.

According to the above steps, a semiconductor device which has a storage element and which can exchange data in a non-contact way can be obtained. The semiconductor device shown in this embodiment has flexibility. When the element group 1444 is pasted to a flexible substrate, a semiconductor device is provided which is thin, lightweight, and difficult to be damaged even when the device is dropped. Moreover, when an inexpensive flexible substrate is used, an inexpensive semiconductor device can be provided. Furthermore, the device can be pasted even to an object having a curved surface or a deformed shape. By reusing the substrate 1400, a semiconductor device can be manufactured at lower cost.

This embodiment can be freely combined with any one of the above Embodiment Mode and Embodiments.

Embodiment 8

Figure 20A:
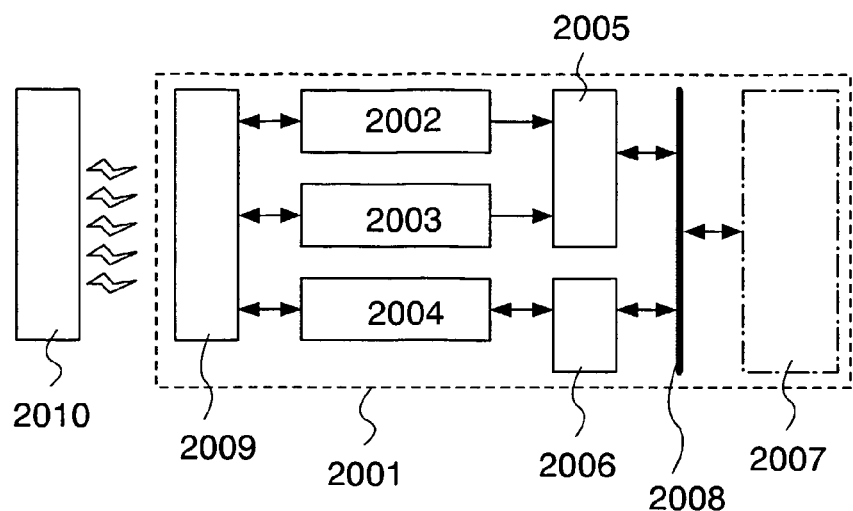
FIGS. 20A to 20C show examples of semiconductor devices according to the present invention.
Figure 20B:
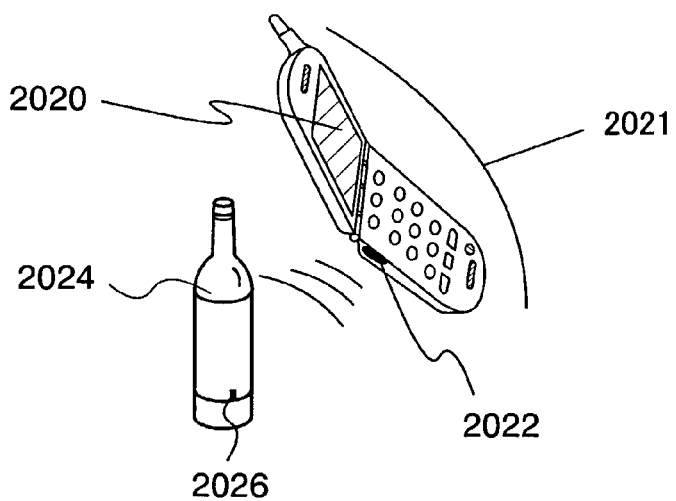
Figure 20C:
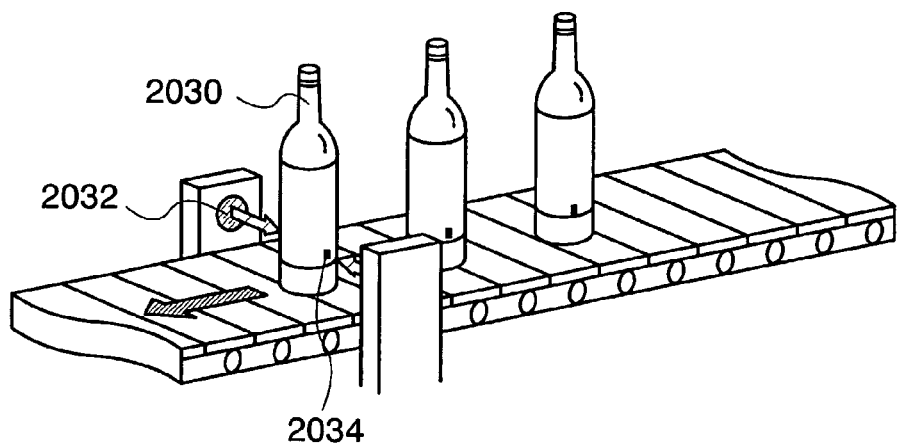

With reference to FIGS. 20A to 20C, this embodiment describes an example of using a semiconductor film crystallized by a laser irradiation apparatus and a laser irradiation method according to the present invention for a radio-frequency IC tag which can exchange data in a non-contact way.

A radio-frequency IC tag 2001 can exchange data in a non-contact way and comprises a power source circuit 2002, clock generator circuits 2003 and 2004, a control circuit 2005 for controlling another circuit, an interface circuit 2006, a memory 2007, a data bus 2008, and an antenna (antenna coil) 2009 (FIG. 20A).

The power source circuit 2002 is a circuit for generating various power sources which are to be supplied to the respective circuits in a semiconductor device based on alternating signals inputted from the antenna 2009. The clock generator circuit 2003 is a circuit for generating various clock signals which are to be supplied to the respective circuits in a semiconductor device based on alternating signals inputted from the antenna 2009. The clock generator circuit 2004 can demodulate and modulate data exchanged with a reader/writer 2010. The control circuit 2005 can control the memory 2007. The antenna 2009 can exchange an electromagnetic field or an electric wave. The reader/writer 2010 controls and exchanges data with the semiconductor device, and controls the process on data which has been controlled and exchanged. An RFID is not limited to the above structure. For example, another element such as a limiter circuit of a power source voltage and hardware only for processing codes may be added.

Moreover, as a method for supplying the power source voltage to each circuit in the radio-frequency IC tag 2001, the followings may be employed; (1) the power source voltage is supplied by receiving the electric wave with the antenna without mounting the power source (battery), (2) the power source voltage is supplied by mounting the power source (battery) instead of the antenna, or (3) the power source voltage is supplied by the electric wave and the power source.

In the case of using a semiconductor device according to the present invention for a radio-frequency IC tag, the IC tag has advantages in that the communication is carried out in a non-contact way, a plurality of data can be read, data can be written in the IC tag, the IC tag can be transformed into various shapes, a high-directional characteristic and a wide recognition range are achieved depending on the selected frequency, and so on. The radio-frequency IC tag can be applied for a tag capable of identifying information of individuals or objects by non-contact radio-frequency communication, a label which can be pasted to an object by a labeling process, a wristband for an event or amusement, and so on. The radio-frequency IC tag may be molded by using a resin material. The radio-frequency IC tag can be used for operating a system such as entrance/exit management, settlement, and stock control.

An example is described in which a semiconductor device manufactured by applying the present invention is used as a radio-frequency IC tag. A reader/writer 2022 is provided at a side surface of a mobile terminal 2021 having a display portion 2020, and a radio-frequency IC tag 2026 is provided at a side surface of an object 2024 (FIG. 20B). When the reader/writer 2022 is held over the radio-frequency IC tag 2026 provided on the object 2024, information on the product such as a material and a production area, inspection results for each production step, a history of the circulation process, a description of the object 2024, and so on are displayed in the display portion 2020.

Moreover, an object 2030 can be inspected by using a reader/writer 2032 and a radio-frequency IC tag 2034 provided on the object 2030 when the object 2030 is transferred by a belt conveyer (FIG. 20C). Thus, the information can be obtained easily by using the radio-frequency IC tag in the system, which allows high functionality and high-added value. Moreover, another advantage is obtained in which excessive stock is decreased and inventory work can be simplified by operating the radio-frequency IC tag in synchronization with the stock control and the shipping system.

This embodiment can be freely combined with any one of the above Embodiment Mode and Embodiments.

101: LASER OSCILLATOR, 102: LASER OSCILLATOR, 103: SLIT, 104: MIRROR, 105: LINEAR OR RECTANGULAR BEAM, 106: CYLINDRICAL LENS, 107: CYLINDRICAL LENS, 108: LINEAR OR RECTANGULAR BEAM, 109: OPTICAL FIBER, 110: BEAM SPOT, 111: SUBSTRATE, 112: SUCTION STAGE, 113: X-STAGE, 114: Y-STAGE, 201: LASER OSCILLATOR, 202: LASER OSCILLATOR, 203: DIFFRACTIVE OPTICAL ELEMENT, 205: SLIT, 206: MIRROR, 207: BEAM, 208: CONDENSING LENS, 209: CONDENSING LENS, 210: BEAM, 211: OPTICAL FIBER, 212: BEAM SPOT, 213: SUCTION STAGE, 214: SUBSTRATE, 215: X-STAGE, 216: Y-STAGE, 401: SLIT OPENING PORTION, 402: BLOCKING FILM, 501: LASER, 502: LASER, 503: OPTICAL ISOLATOR, 504: OPTICAL ISOLATOR, 505: BEAM EXPANDER, 506: BEAM EXPANDER, 507: BEAM EXPANDER, 508: BEAM EXPANDER, 509: MIRROR, 510: MIRROR, 511: MIRROR, 512: MIRROR, 513: DUMPER, 514: DUMPER, 515: SLIT, 516: LASER BEAM, 517: MIRROR, 518: CYLINDRICAL LENS, 519: CYLINDRICAL LENS, 520: SUBSTRATE, 521:BEAM SPOT, 522: LASER OSCILLATOR, 523: OPTICAL FIBER, 524: BEAM SPOT, 525: SUCTION STAGE, 526: X-STAGE, 527: Y-STAGE, 700: SUBSTRATE, 701: BASE FILM, 702: AMORPHOUS SEMICONDUCTOR FILM, 703: LASER, 704: SPHERICAL LENS, 705: LASER, 706: CRYSTALLINE SEMICONDUCTOR FILM, 707: ISLAND-SHAPED SEMICONDUCTOR FILM, 708: GATE INSULATING FILM, 709: GATE ELECTRODE, 710: SOURCE REGION, 711: DRAIN REGION, 712: LDD REGION, 713: N-CHANNEL TFT, 714: N-CHANNEL TFT, 715: P-CHANNEL TFT, 716: INSULATING FILM, 717: INSULATING FILM, 718: WIRING 719: INSULATING FILM, 801: SEMICONDUCTOR FILM, 802: BEAM SPOT BY HARMONIC, 803: BEAM SPOT BY FUNDAMENTAL WAVE, 804: BEAM SPOT BY HARMONIC, 805: BEAM SPOT BY HARMONIC, 806: BEAM SPOT BY HARMONIC, 807: LASER PITCH, 808: LASER-OVERLAPPING REGION, 901: SOURCE SIGNAL LINE, 902: GATE SIGNAL LINE, 903: CURRENT SUPPLYING LINE, 904: SWITCHING TFT, 905: DRIVER TFT, 906: CAPACITOR, 907: LIGHT-EMITTING ELEMENT, 1001: CASE, 1002: SUPPORTING STAND, 1003: DISPLAY PORTION, 1004: SPEAKER PORTIONS, 1005: VIDEO INPUT TERMINAL, 1011: CASE, 1012: DISPLAY PORTION, 1013: KEYBOARD, 1014: EXTERNAL CONNECTION PORT, 1015: POINTING MOUSE, 1041: PASSPORT, 1042: IC TAQ 1051: IC TAG 1052: READER, 1053: ANTENNA PORTION, 1054: DISPLAY PORTION, 1101: BEAM SPOT, 1102: ENERGY DENSITY DISTRIBUTION, 1103: CENTER REGION OF BEAM SPOT, 1104: END REGION OF BEAM SPOT, 1200: SUBSTRATE, 1201: BASE FILM, 1202: SEMICONDUCTOR FILM, 1203: CRYSTALLIZED FILM, 1204: TWO LASER BEAMS, 1205: SEMICONDUCTOR FILM, 1206: OXIDE FILM, 1207: SEMICONDUCTOR FILM FOR GETTERING, 1208: ISLAND-SHAPED SEMICONDUCTOR FILM, 1400: FIRST SUBSTRATE, 1402: INSULATING FILM, 1404: PEELING LAYER, 1406: INSULATING FILM, 1408: SEMICONDUCTOR FILM, 1410: CRYSTALLINE SEMICONDUCTOR FILM, 1412: FIRST SEMICONDUCTOR FILM, 1414: SECOND SEMICONDUCTOR FILM, 1416: RESIST MASK, 1418: FIRST INSULATING FILM, 1420: FIRST INSULATING FILM, 1422: SECOND INSULATING FILM, 1424: THIRD INSULATING FILM, 1426: CONDUCTIVE FILM, 1426a: FIRST CONDUCTIVE FILM, 1428:CONDUCTIVE FILM, 1428a: SECOND CONDUCTIVE FILM, 1430: INSULATING FILM, 1432: CONDUCTIVE FILM, 1434: THIN FILM TRANSISTOR, 1436: THIN FILM TRANSISTOR, 1438: INSULATING FILM, 1440: CONDUCTIVE FILM, 1442: INSULATING FILM, 1444: ELEMENTS, 1446: OPENING PORTION, 1448: FIRST SHEET MATERIAL, 1450: SECOND SHEET MATERIAL, 1452: THIRD SHEET MATERIAL, 2001: RADIO FREQUENCY IC TAQ 2002: POWER SOURCE CIRCUIT, 2003: CLOCK GENERATOR CIRCUIT, 2004: CLOCK GENERATOR CIRCUIT, 2005: CONTROL CIRCUIT, 2006: INTERFACE CIRCUIT, 2007: MEMORY, 2008: DATA BUS, 2009: ANTENNA, 2010: READER/WRITER, 2020: DISPLAY PORTION, 2021: MOBILE TERMINAL, 2022: READER/WRITER, 2024: OBJECT, 2026: RADIO FREQUENCY IC TAQ 2030: OBJECT, 2032: READER/WRITER, 2034: RADIO FREQUENCY IC TAG

The invention claimed is:

1. A laser irradiation apparatus comprising:
a first laser oscillator;
a second laser oscillator;
a slit for blocking an end portion of a first laser beam emitted from the first laser oscillator;
a condensing lens;
means for delivering a second laser beam emitted from the second laser oscillator so as to cover a range irradiated with the first laser beam on an irradiation surface;
means for moving the irradiation surface in a first direction relative to the first laser beam and the second laser beam; and
means for moving the irradiation surface in a second direction relative to the first laser beam and the second laser beam,
wherein the first laser oscillator and the second laser oscillator are pulsed lasers having a repetition rate of 10 MHz or more,
wherein the first laser beam is a harmonic and the second laser beam is a fundamental wave, and
wherein a laser spot of the second laser beam covers the whole beam spot of the first laser beam on the irradiation surface.

2. A laser irradiation apparatus comprising:
a first laser oscillator;
a second laser oscillator;
a diffractive optical element;
a slit for blocking an end portion of a first laser beam emitted from the first laser oscillator;
a condensing lens;

means for delivering a second laser beam emitted from the second laser oscillator so as to cover a range irradiated with the first laser beam on an irradiation surface after passing through the diffractive optical element;
means for moving the irradiation surface in a first direction relative to the first laser beam and the second laser beam; and
means for moving the irradiation surface in a second direction relative to the first laser beam and the second laser beam,
wherein the first laser oscillator and the second laser oscillator are pulsed lasers having a repetition rate of 10 MHz or more,
wherein the first laser beam is a harmonic and the second laser beam is a fundamental wave, and
wherein a laser spot of the second laser beam covers the whole beam spot of the first laser beam on the irradiation surface.

3. The laser irradiation apparatus according to claim 1 or 2, wherein the harmonic is obtained by converting the first laser beam by a non-linear optical element.

4. The laser irradiation apparatus according to claim 1 or 2, wherein the first laser oscillator and the second laser oscillator are pulsed lasers having a medium of a single-crystal YAG, $YVO_4$, YLF, $YAlO_3$, or $GdVO_4$, or a poly-crystal YAG, $Y_2O_3$, $YVO_4$, $YAlO_3$, or $GdVO_4$, each of which is added with one or plural elements selected from the group consisting of Nd, Yb, Cr, Ti, Ho, Er, Tm, and Ta as dopant.

5. The laser irradiation apparatus according to claim 1 or 2, wherein the condensing lens is a cylindrical lens or a spherical lens.

6. The laser irradiation apparatus according to claim 1 or 2, wherein the first direction and the second direction intersect with each other.

7. A laser irradiation method comprising:
emitting a first laser beam from a first laser oscillator;
passing the first laser beam through a slit to form a second laser beam;
condensing the second laser beam by a condensing lens to form a third laser beam;
delivering the third laser beam to an irradiation surface;
delivering a fourth laser beam emitted from a second laser oscillator so as to cover the third laser beam on the irradiation surface; and
scanning the third laser beam and the fourth laser beam relative to the irradiation surface,
wherein the first laser oscillator and the second laser oscillator are pulsed lasers having a repetition rate of 10 MHz or more,
wherein the first laser beam is a harmonic and the second laser beam is a fundamental wave, and
wherein a laser spot of the third laser beam covers the whole beam spot of the fourth laser beam on the irradiation surface.

8. A laser irradiation method comprising:
emitting a first laser beam from a first laser oscillator;
passing the first laser beam through a difrractive optical element to form a second laser beam;
passing the second laser beam through a slit to form a third laser beam;
condensing the third laser beam by a condensing lens to form a fourth laser beam;
delivering the fourth laser beam to an irradiation surface;
delivering a fifth laser beam emitted from a second laser oscillator so as to cover the fourth laser beam on the irradiation surface; and
scanning the fourth laser beam and the fifth laser beam relative to the irradiation surface,
wherein the first laser oscillator and the second laser oscillator are pulsed lasers having a repetition rate of 10 MHz or more,
wherein the first laser beam is a harmonic and the second laser beam is a fundamental wave, and
wherein a laser spot of the fifth laser beam covers the whole beam spot of the fourth laser beam on the irradiation surface.

9. The laser irradiation method according to claim 7 or 8, wherein the harmonic is obtained by converting the first laser beam by a non-linear optical element.

10. The laser irradiation method according to claim 7 or 8, wherein the first laser oscillator and the second laser oscillator are pulsed lasers having a medium of a single-crystal YAG, $YVO_4$, YLF, $YAlO_3$, or $GdVO_4$, or a poly-crystal YAG, $Y_2O_3$, $YVO_4$, $YAlO_3$, or $GdVO_4$, each of which is added with one or plural elements selected from the group consisting of Nd, Yb, Cr, Ti, Ho, Er, Tm, and Ta as dopant.

11. The laser irradiation method according to claim 7 or 8, wherein the condensing lens is a cylindrical lens or a spherical lens.

12. A laser irradiation apparatus comprising:
a first laser oscillator;
a second laser oscillator;
a slit for blocking end portions of a first laser beam emitted from the first laser oscillator;
an optical fiber for delivering a second laser beam emitted from the second laser oscillator so as to cover a range irradiated with the first laser beam on an irradiation surface,
wherein the first laser oscillator and the second laser oscillator are pulsed lasers having a repetition rate of 10 MHz or more,
wherein the first laser beam is a harmonic and the second laser beam is a fundamental wave, and
wherein a laser spot of the second laser beam covers the whole beam spot of the first laser beam on the irradiation surface.

* * * * *